United States Patent
Park et al.

(10) Patent No.: US 8,305,817 B2
(45) Date of Patent: Nov. 6, 2012

(54) NONVOLATILE MEMORY DEVICES AND PROGRAM METHODS THEREOF IN WHICH A TARGET VERIFY OPERATION AND A PRE-PASS VERIFY OPERATION ARE PERFORMED SIMULTANEOUSLY USING A COMMON VERIFY VOLTAGE

(75) Inventors: Kitae Park, Seongnam-si (KR); Donghyuk Chae, Seoul (KR); Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 200 days.

(21) Appl. No.: 12/722,056

(22) Filed: Mar. 11, 2010

(65) Prior Publication Data
US 2011/0007571 A1 Jan. 13, 2011

(30) Foreign Application Priority Data
Jul. 13, 2009 (KR) ........................ 10-2009-0063632

(51) Int. Cl.
*G11C 16/06* (2006.01)

(52) U.S. Cl. ......... 365/185.22; 365/185.14; 365/185.01; 365/185.17; 365/185.11

(58) Field of Classification Search ............. 365/185.22, 365/185.14, 185.01, 185.17, 185.11
See application file for complete search history.

(56) References Cited

U.S. PATENT DOCUMENTS

| 5,172,338 | A | 12/1992 | Mehrotra et al. |
| 5,293,560 | A | 3/1994 | Harari |
| 5,812,451 | A | 9/1998 | Iwata |
| 6,028,792 | A | 2/2000 | Tanaka et al. |
| 7,224,614 | B1 | 5/2007 | Chan |
| 7,643,348 | B2 | 1/2010 | Cernea |
| 2009/0003056 | A1* | 1/2009 | Chun et al. ............... 365/185.03 |

FOREIGN PATENT DOCUMENTS

| JP | 09-307082 | 11/1997 |
| JP | 10-214492 | 8/1998 |
| KR | 10-0243825 B1 | 11/1999 |
| KR | 10-0272035 | 8/2000 |
| KR | 1020080096645 A | 10/2008 |

\* cited by examiner

*Primary Examiner* — Thong Q Le
(74) *Attorney, Agent, or Firm* — Myers Bigel Sibley & Sajovec, P.A.

(57) ABSTRACT

Provided are nonvolatile memory devices and program methods thereof. A nonvolatile memory device provides a program voltage to a selected word line and performs a program verify operation. The nonvolatile memory device controls a bit line voltage of the next program loop according to the program verification result. In the program verification operation, a target verify voltage is used as a pre-verify voltage. The nonvolatile memory device controls the bit line voltage of the next program loop according to the program verification result, thus making it possible to reduce the threshold voltage distribution of a memory cell. Also, the nonvolatile memory device uses the target verify voltage as the pre-verify voltage, thus making it possible to increase the program verification speed.

24 Claims, 29 Drawing Sheets

(Cell state after Vpgm(n-1))

| Cells | A | B | C | D | E |
|---|---|---|---|---|---|
| Result of VFY(n-1) | Pre Pass | Pre Pass | Fail | Fail | Pre Pass |

(Cell state after Vpgm(n))

| Cells | A | B | C | D | E |
|---|---|---|---|---|---|
| Result of VFY(n) | Pre Pass | Final Pass | Fail | Pre Pass | Final Pass |

(Cell state after Vpgm(n+1))

| Cells | A | B | C | D | E |
|---|---|---|---|---|---|
| Result of VFY(n+1) | Final Pass | Final Pass | Pre Pass | Final Pass | Final Pass |

(Cell state after Vpgm(n-1))

| Cells | a | b | c | d | e |
|---|---|---|---|---|---|
| Result of VFY(n-1) | Pre Pass | Pre Pass | Fail | Fail | Pre Pass |
| Loop Counter | STOP (11) | STOP (11) | NOP (00) | NOP (00) | START (01) |

(Cell state after Vpgm(n))

| Cells | a | b | c | d | e |
|---|---|---|---|---|---|
| Result of VFY(n) | Pre Pass | Final Pass | Fail | Pre Pass | Pre Pass |
| Loop Counter | STOP (11) | STOP (11) | NOP (00) | START (01) | ADD (10) |

(Cell state after Vpgm(n+1))

| Cells | a | b | c | d | e |
|---|---|---|---|---|---|
| Result of VFY(n+1) | Final Pass | Final Pass | Pre Pass | Pre Pass | Pre Pass |
| Loop Counter | STOP (11) | STOP (11) | START (01) | ADD (10) | STOP (11) |

(Cell state after Vpgm(n+2))

| Cells | a | b | c | d | e |
|---|---|---|---|---|---|
| Result of VFY(n+2) | Final Pass | Final Pass | Pre Pass | Pre Pass | Final Pass |
| Loop Counter | STOP (11) | STOP (11) | ADD (10) | STOP (11) | STOP (11) |

NONVOLATILE MEMORY DEVICES AND PROGRAM METHODS THEREOF IN WHICH A TARGET VERIFY OPERATION AND A PRE-PASS VERIFY OPERATION ARE PERFORMED SIMULTANEOUSLY USING A COMMON VERIFY VOLTAGE

CROSS-REFERENCE TO RELATED APPLICATION

This U.S. non-provisional patent application claims priority under 35 U.S.C. §119 of Korean Patent Application No. 10-2009-0063632, filed on Jul. 13, 2009, the entire contents of which are hereby incorporated by reference.

BACKGROUND

The present invention disclosed herein relates generally to semiconductor memory devices, and more particularly, to nonvolatile memory devices and programming methods thereof.

Semiconductor memory devices are generally categorized into volatile memory devices (e.g., DRAMs and SRAMs) and nonvolatile memory devices (e.g., EEPROMs, FRAMs, PRAMs, MRAMs, and flash memories). A volatile memory devices loses stored data when the power supply is interrupted; whereas a nonvolatile memory device retains stored data even when the power supply is interrupted. In particular, a flash memory is widely used as a storage medium in a computer system because of its high program speed, low power consumption and large storage capacity.

A flash memory may store 1-bit data or 2-bit or more data in one memory cell. In general, a memory cell storing 1-bit data is called a single level cell (SLC), and a memory cell storing 2-bit or more data is called a multi level cell (MLC). The SLC has an erase state and a program state according to a threshold voltage, and the MLC has an erase state and a plurality of program states according to a threshold voltage.

In the case of a flash memory with MLCs (hereinafter referred to as an MLC flash memory), it is generally desirable to secure a margin between program states by reducing the width of a threshold voltage distribution in a program state.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

According to some embodiments of the present invention, a non-volatile memory device is programmed by performing a first program-verify loop on a memory cell of the non-volatile memory device having a plurality of programmable states associated therewith, the first program-verify loop comprising a first program operation and a first at least one verify operation and determining that the memory cell is in a pass state when a result of the at least one verify operation indicates the memory cell is in a targeted programmed state, is in a pre-pass state when the result of the at least one verify operation indicates that the memory cell is in within a defined state difference of the targeted programmed state, and is in a fail state when the result of the at least one verify operation indicates that the memory cell is not within the defined state difference of the targeted programmed state.

In other embodiments of the present invention, a non-volatile memory device is programmed by performing a program-verify loop on a memory cell of the non-volatile memory device having a plurality of programmable states associated therewith, the program-verify loop comprising a program operation and at least one verify operation such that a pre-pass verify operation and a target verify operation are performed simultaneously using a common verify voltage for a first one of the programmable states and a second one of the plurality of programmable states, respectively.

In still other embodiments of the present invention, a non-volatile memory device is programmed by performing a first program-verify loop on a memory cell of the non-volatile memory device having a plurality of programmable states associated therewith, the first program-verify loop comprising a first program operation and a first at least one verify operation; determining that the memory cell is in a pass state when a result of the at least one verify operation indicates the memory cell is in a targeted programmed state, is in a pre-pass state when the result of the at least one verify operation indicates that the memory cell is in within a defined state difference of the targeted programmed state, and is in a fail state when the result of the at least one verify operation indicates that the memory cell is not within the defined state difference of the targeted programmed state and performing at least one subsequent program-verify loop on the memory cell, each of the at least one subsequent program-verify loop comprising a program operation and at least one verify operation, such that a programming voltage is applied to a bit-line associated with the memory cell when the memory cell is in the pre-pass state until a program-verify loop count is reached or a determination is made that the memory cell is in the targeted programming state.

Although described primarily above with respect to methods of programming a non-volatile memory device, embodiments of the present invention include, but are not limited to, non-volatile memory devices and systems/apparatus incorporating the same.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
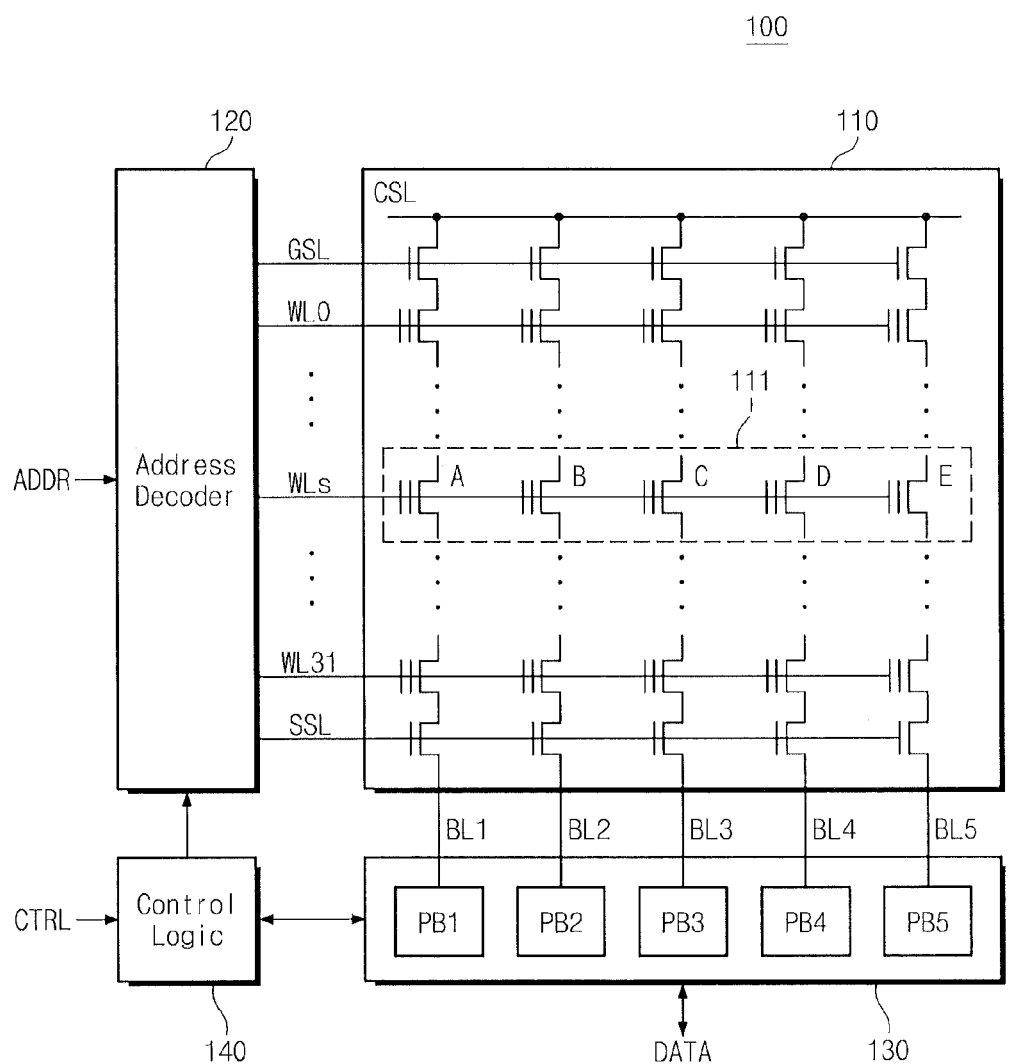
FIG. 1 is a block diagram of a nonvolatile memory device according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For purposes of illustration, various embodiments of the present invention are described herein with reference to a memory system comprising a flash memory data storage device. It will be understood that the data storage device is not limited to implementation as a flash memory device, but can be implemented generally as an erase before write memory device. Also, it will be understood that the data storage device is not limited to implementation as a non-volatile memory device, and can be implemented as a volatile memory device, such as a dynamic random access memory (DRAM), and so on. The data storage device may be a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

Hereinafter, exemplary embodiments of the present invention will be described in detail with reference to the accompanying drawings.

FIG. 1 is a block diagram of a nonvolatile memory device according to an embodiment of the present invention. In FIG. 1, a flash memory device is exemplified as a nonvolatile memory device.

Referring to FIG. 1, a nonvolatile memory device 100 includes a memory cell array 110, an address decoder 120, a data input/output circuit 130, and a control logic unit 140. In some embodiments, the nonvolatile memory device 100 comprises a flash memory, which may be a NAND, NOR, and/or a One_NAND type flash memory.

The memory cell array 110 may include a plurality of memory blocks. As an example, one memory block is illustrated in FIG. 1. Each memory block may include a plurality of pages. Each page (e.g., 111) may include a plurality of memory cells (e.g., A~E). The nonvolatile memory device 100 may perform an erase operation on a block basis and may perform a write or read operation on a page basis.

Each memory cell may store 1-bit data or 2-bit or more data. A memory cell capable of storing 1-bit data is called a single level cell (SLC) or a single bit cell, and a memory cell capable of storing 2-bit or more data is called a multi level cell (MLC) or a multi bit cell. The SLC has an erase state or a program state according to a threshold voltage. The MLC has an erase state or one of a plurality of program states according to a threshold voltage.

Referring to FIG. 1, the memory cell array 110 has a cell string structure. A cell string includes a string selection transistor connected to a string selection line SSL, a plurality of memory cells connected to a plurality of word lines WL0~WL31, and a ground selection transistor connected to a ground selection line GSL. The string selection transistor is connected to a bit line BL, and the ground selection transistor is connected to a common source line CSL.

A plurality of memory cells A, B, C, D and E may be connected to a word line (e.g., WLs). For the convenience of description, five memory cells are illustrated in FIG. 1. However, more memory cells may be connected to a word line. A set of memory cells A, B, C, D and E, which are connected to the selected word line WLs and programmed simultaneously, is generally called a page. In FIG. 1, the memory cells of the selected page 111 are programmed simultaneously.

Referring to FIG. 1, the address decoder 120 is connected to the memory cell array 110 through the selection lines SSL and CSL or the word lines WL0~WL31. In a program or read operation, the address decoder 120 receives an address ADDR and selects a word line (e.g., WLs). Meanwhile, the address decoder 120 transfers a bias voltage for a program or read operation to the selected word line WLs or the unselected word lines (i.e., all but the WLs).

The data input/output circuit 130 is connected through the bit lines BL1~BL5 to the memory cell array 110. In a program operation, the data input/output circuit 130 receives data DATA from the outside and transfers program data to the selected page 111. In a read operation, the data input/output circuit 130 reads data from the selected page 111 and outputs data DATA to the outside.

The data input/output circuit 130 includes a plurality of page buffers PB1~PB5. The page buffers PB1~PB5 may temporarily store the data to be programmed into the selected page 111 or the data read from the selected page 111. The data stored in each page buffer (e.g., PB1) is programmed into the selected memory cell (e.g., A) through the bit line (e.g., BL1).

The control logic unit 140 may control a program/read/erase operation of the nonvolatile memory device 100. For example, in a program operation, the control logic unit 140 may control the address decoder 120 to provide a program voltage to the selected word line WLs and may control the data input/output circuit 130 to provide program data to the selected page 111. The control logic unit 140 may perform a program/read/erase operation according to an external control signal CTRL.

Figure 2:
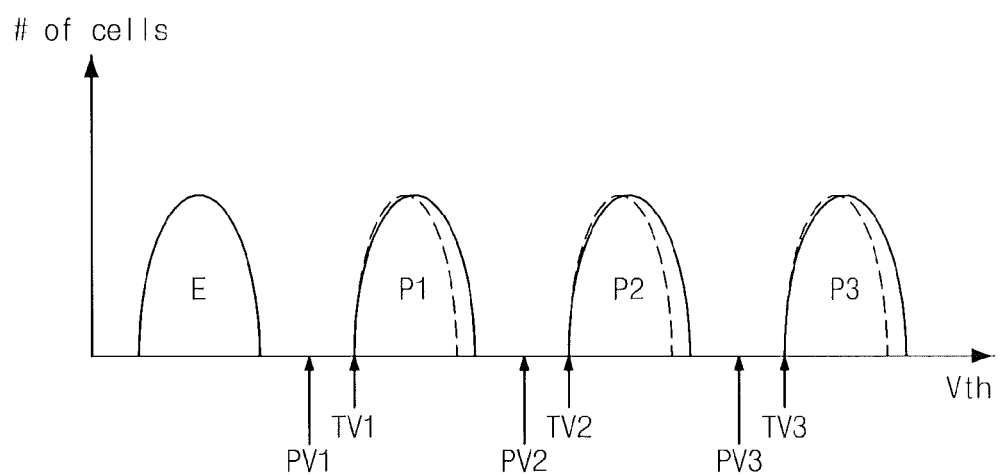
FIGS. 2 to 4 are diagrams illustrating the threshold voltage distribution of memory cells illustrated in FIG. 1.
Figure 3:
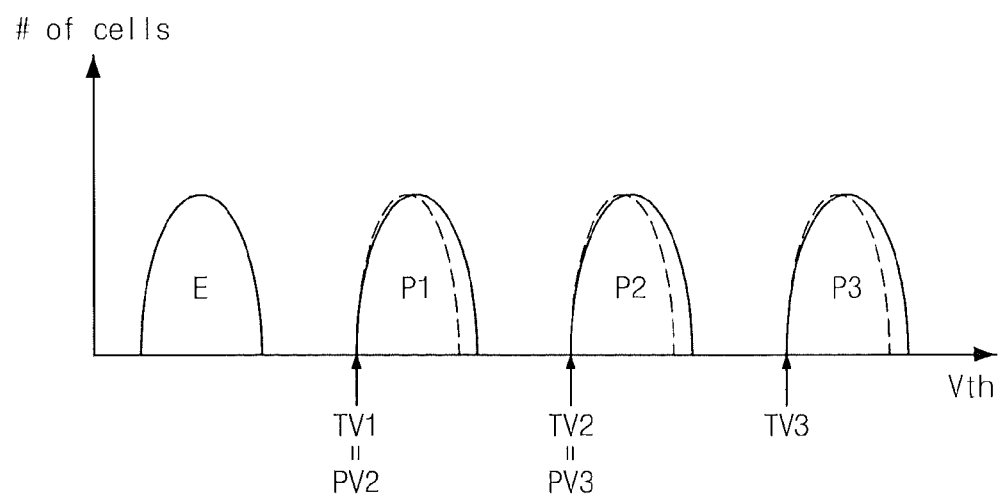
Figure 4:
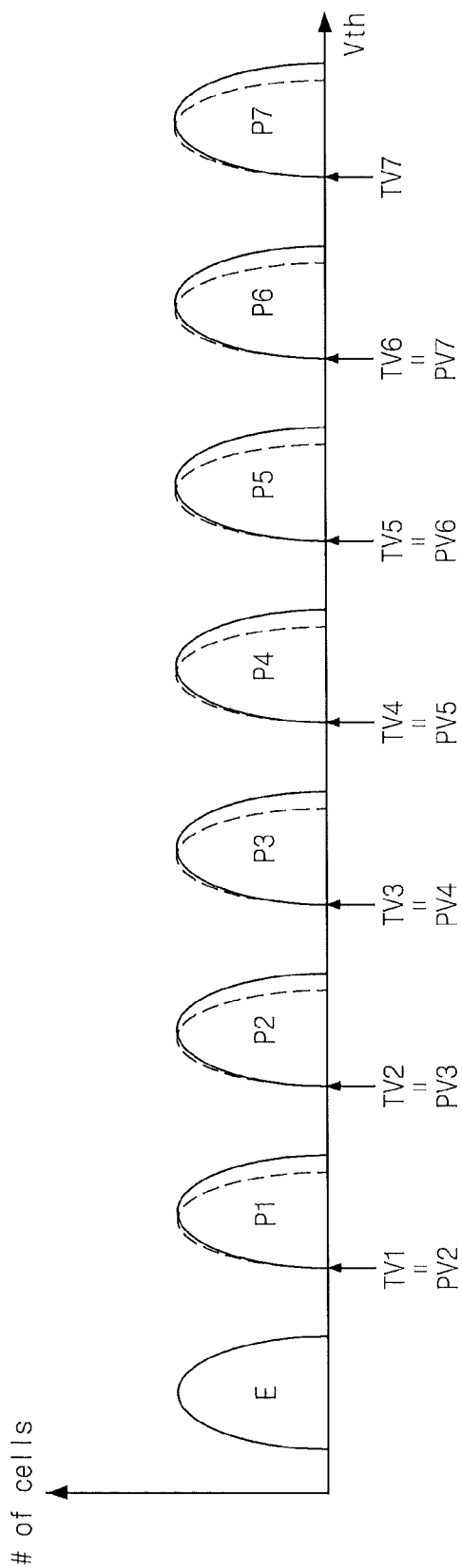

FIGS. 2 to 4 are diagrams illustrating the threshold voltage distribution of the memory cells illustrated in FIG. 1. In FIGS. 2 to 4, the axis of abscissas represents a threshold voltage (Vth) and the axis of ordinates represents the number of memory cells (# of cells).

Referring to FIGS. 2 and 3, a memory cell may have one of 4 states E, P1, P2 and P3 according to the threshold voltage distribution (see FIGS. 2 and 3), Herein, E denotes an erase state of the memory cell. Also, P1, P2 and P3 denote program states. 2-bit data may be stored in the memory cell with 4 states. Referring to FIG. 4, a memory cell may have one of eight or more states. 3-bit data may be stored in a memory cell with eight states.

The nonvolatile memory device 100 of FIG. 1 may perform a pre-verify operation and a target verify operation. A pre-verify voltage is provided in the pre-verify operation, and a target verify voltage is provided in the target verify operation. In FIG. 2, PV1, PV2 and PV3 denote pre-verify voltages, and TV1, TV2 and TV3 denote target verify voltages.

In FIG. 2, a solid line denotes the threshold voltage distribution in the case of performing only a target verify operation.

Also, a broken line denotes the threshold voltage distribution in the case of performing a pre-verify operation and a target verify operation. The nonvolatile memory device 100 of FIG. 1 further performs a pre-verify operation before a target verify operation, according to some embodiments of the present invention, thus making it possible to reduce the threshold voltage distribution. When the threshold voltage distribution of the memory cell is reduced, the nonvolatile memory device 100 can achieve a larger read margin.

On the other hand, the nonvolatile memory device 100 of FIG. 1 may perform a pre-verify operation and a target verify operation simultaneously. Referring to FIG. 3 as an example, the first target verify voltage TV1 may be used as the second pre-verify voltage PV2. Also, the second target verify voltage TV2 may be used as the third pre-verify voltage PV3. That is, a target verify operation for the program state P1 and a pre-verify operation for the program state P2 may be performed simultaneously. Also, a target verify operation for the program state P2 and a pre-verify operation for the program state P3 may be performed simultaneously.

As illustrated in FIG. 4, a program verification method capable of simultaneously performing a pre-verify operation and a target verify operation is also applicable to a nonvolatile memory device that can store 3-bit or more data in one memory cell. The use of a program verification method illustrated in FIGS. 3 and 4, according to some embodiments of the present invention, makes it possible not only to reduce the threshold voltage distribution of a memory cell but also to increase the program verification speed. A program verification method capable of simultaneously performing a pre-verify operation and a target verify operation will be described below in detail.

Figure 5:
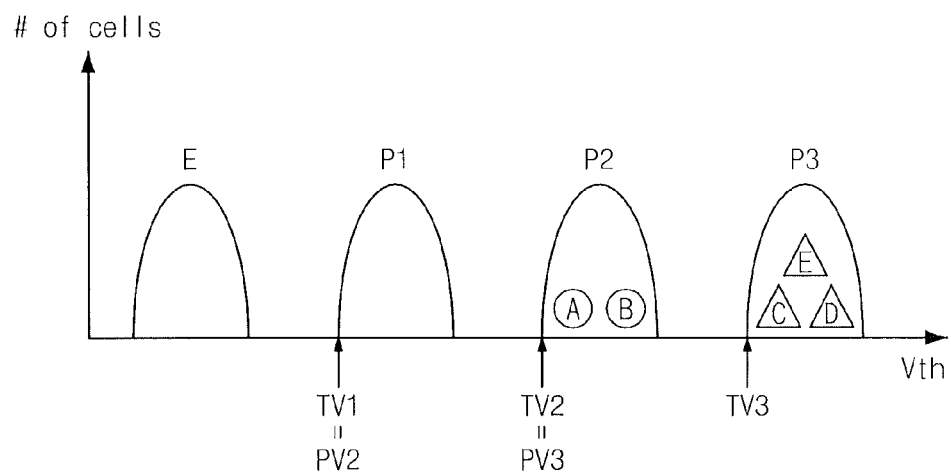
FIG. 5 is a diagram illustrating an example of the target threshold voltages of memory cells A, B, C, D and E illustrated in FIG. 1.

FIG. 5 illustrates the case where the memory cells A, B, C, D and E of FIG. 1 may have 4 states E, P1, P2 and P3. In this case, 2-bit data may be stored in each memory cell. FIG. 5 is a diagram illustrating an example of the target threshold voltages of the memory cells A, B, C, D and E illustrated in FIG. 1. In FIG. 5, it is assumed that the cells A and B (denoted by circles) are programmed from the state E to the state P2. Also, it is assumed that the cells C to E (denoted by triangles) are programmed from the state E to the state P3.

Figure 6:
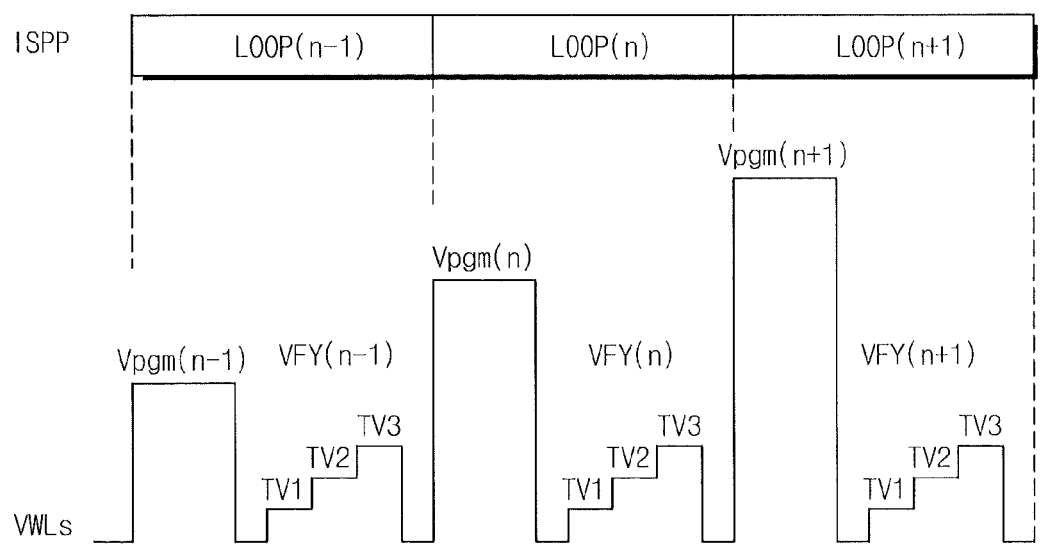
FIG. 6 is a diagram illustrating a program voltage Vpgm applied to a selected word line WLs of FIG. 1.

FIG. 6 is a diagram illustrating a program voltage Vpgm applied to the selected word line WLs of FIG. 1. Herein, the program voltage Vpgm is a voltage for programming the memory cells A, B, C, D and E into the state P2 or P3 illustrated in FIG. 5. The nonvolatile memory device 100 may increase the program voltage Vpgm gradually by program loop. This program scheme is called an incremental step pulse program (ISPP) scheme. On the other hand, the nonvolatile memory device may maintain the constant program voltage Vpgm or may gradually reduce the program voltage Vpgm.

FIG. 6 illustrates program loops LOOP(n−1), LOOP(n) and LOOP(n+1) among many program loops. Referring to FIG. 6, Vpgm(n−1) and VFY(n−1) are applied in LOOP(n−1). Herein, Vpgm(n−1) denotes a program voltage and VFY(n−1) denotes a program verify voltage. VFY(n−1) is used to verify the states P2 and P3 after application of Vpgm(n−1). Likewise, Vpgm(n) and VFY(n) are applied in LOOP(n). Also, Vpgm(n+1) and VFY(n+1) are applied in LOOP(n+1). TV1, TV2, and TV3 are applied to verify the states P1, P2, and P3, respectively. Herein, some of the target verify voltages provided for the respective program loops may be omitted according to the program data. For example, TV3 may be omitted in LOOP(n−1) and TV1 may be omitted in LOOP (N+1).

Figures 7, 8:
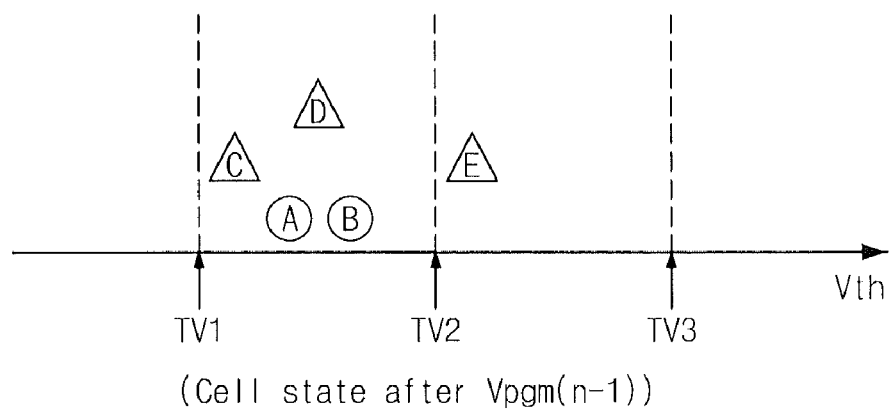
FIGS. 7 and 8 illustrate the program verification results and the threshold voltages of memory cells after application of Vpgm(n−1)
Figure 9:
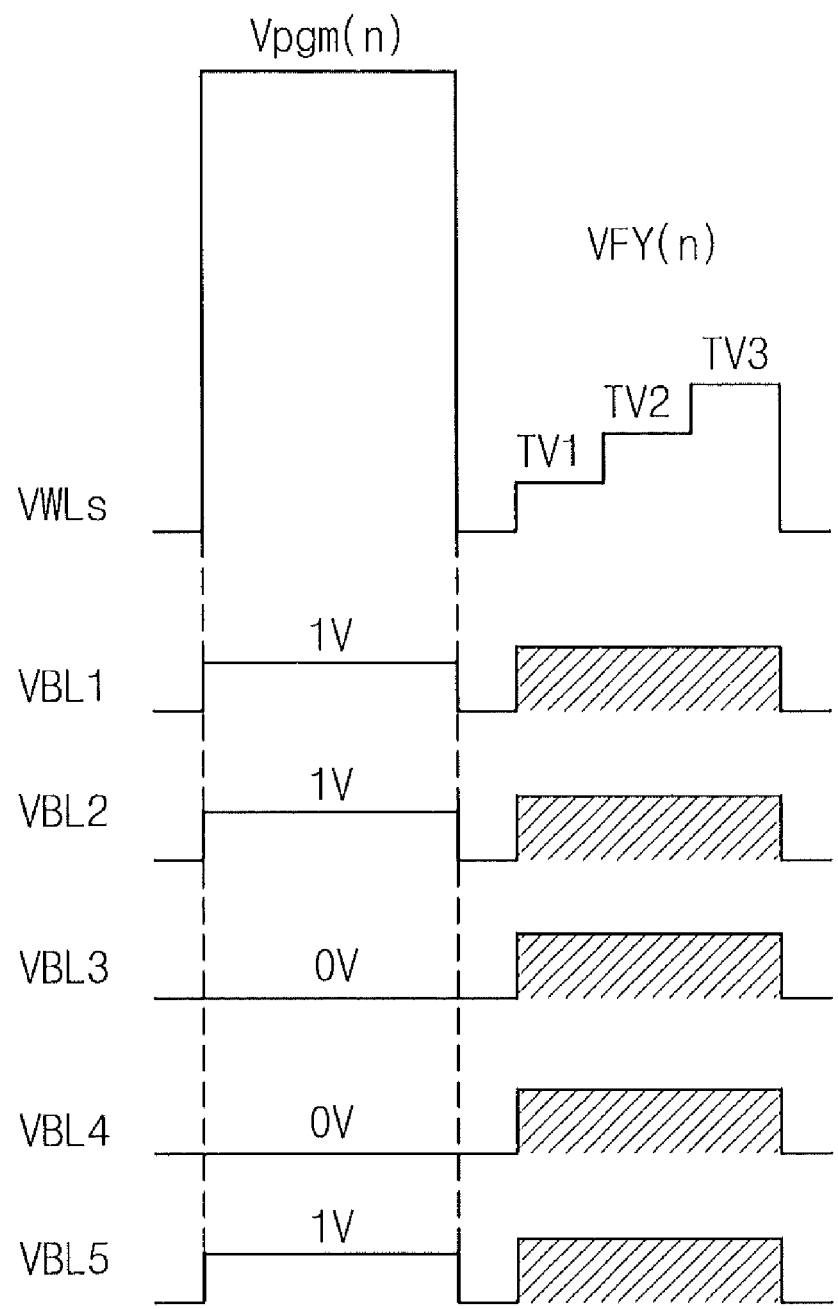
FIGS. 9 to 11 illustrate the program verification results and the threshold voltages of memory cells after application of Vpgm(n)
Figures 10, 11:
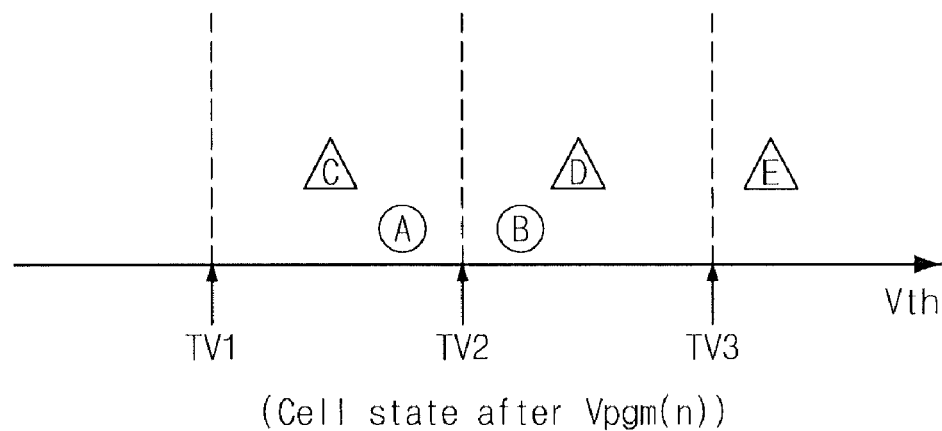
Figure 12:
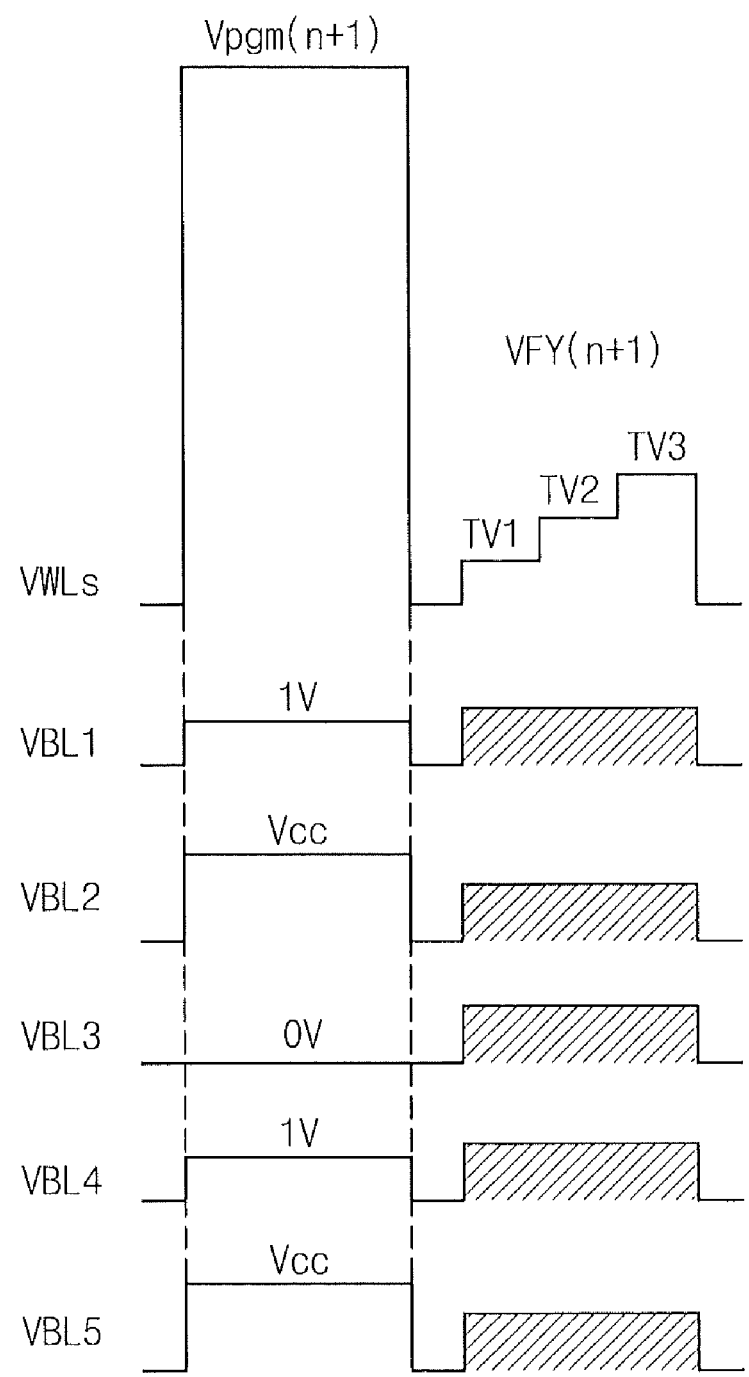
FIGS. 12 to 14 illustrate the program verification results and the threshold voltages of memory cells after application of Vpgm(n+1)
Figures 13, 14:
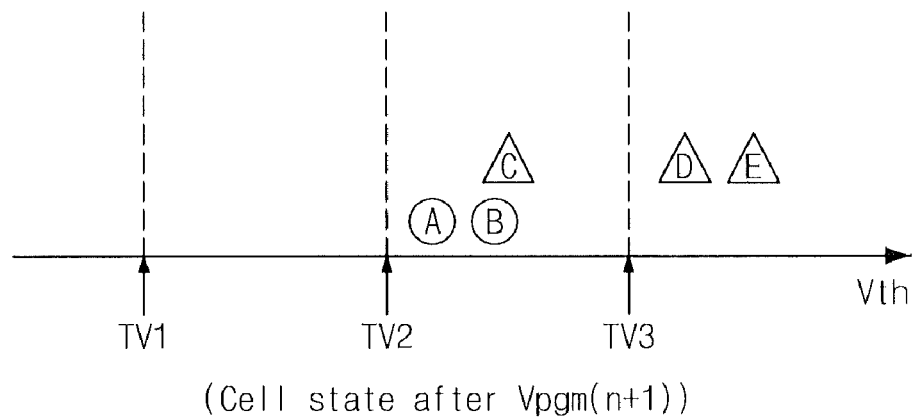

FIGS. 7 and 8 illustrate the program verification results and the threshold voltages of the memory cells after application of Vpgm(n−1). FIGS. 9 to 11 illustrate the program verification results and the threshold voltages of the memory cells after application of Vpgm(n). FIGS. 12 to 14 illustrate the program verification results and the threshold voltages of the memory cells after application of Vpgm(n+1).

FIG. 7 is a diagram illustrating the threshold voltages of the memory cells A, B, C, D and E after application of the program voltage Vpgm(n−1) in LOOP(n−1). Referring to FIG. 7, the threshold voltages of the cells A to D are between TV1 and TV2. Also, the threshold voltage of the cell E is between TV2 and TV3.

As described above, the cells A and B (denoted by circles) will be programmed into the state P2. Thus, the target verify voltage of the cells A and B is TV2. Also, the cells C, D and E (denoted by triangles) will be programmed into the state P3. Thus, the target verify voltage of the cells C, D and E is TV3.

The target verify voltage TV1 may be used as the pre-verify voltage PV2 of the cells A and B. Also, the target verify voltage TV2 may be used as the pre-verify voltage PV3 of the cells C to E. For example, when the target verify voltage TV2 is applied, it can be detected whether the cells A and B have reached the state P2. Also, it can be detected whether the cells C to E have reached the state P2 that is one level lower than the state P3.

Hereinafter, a state lower than a target state will be called a pre-target state. The pre-target state may have a threshold voltage distribution lower by one or more levels than the target state. If the memory cell reaches the target state, the program verification result will be Final Pass. If the memory cell reaches the pre-target state, the program verification result will be Pre-Pass. If the memory cell fails to reach the pre-target state, the program verification result will be Fail.

FIG. 8 is a table illustrating the program verification results after application of the program voltage Vpgm(n−1). Referring to FIG. 8, the cells A, B and E are determined as Pre-Pass, and the cells C and D are determined as Fail.

The threshold voltages of the cells A and B are higher than the pre-verify voltage PV2 (i.e., TV1) and lower than the target verify voltage TV2. Thus, as a result of the program verification, the cells A and B will be determined as Pre-Pass. The threshold voltages of the cells C and D are lower than the pre-verify voltage PV3 (i.e., TV2). Thus, as a result of the program verification, the cells C and D will be determined as Fail. The threshold voltage of the cell E is higher than the pre-verify voltage PV3 (i.e., TV2) and lower than the target verify voltage TV3. Thus, as a result of the program verification, the cell E will be determined as Pre-Pass.

The nonvolatile memory device 100 of FIG. 1 may control a bit line voltage of the next program loop according to the program verification result of the current program loop. For example, if the program verification result of the nonvolatile memory device 100 is Pre-Pass, a bit line forcing voltage between 0V and Vcc may be provided in the next program loop.

The nonvolatile memory device 100 of FIG. 1 controls a bit line voltage of the next program loop according to the program verification result, thus making it possible to reduce the threshold voltage distribution of a memory cell. Also, the nonvolatile memory device 100 of FIG. 1 uses the target verify voltage as the pre-verify voltage, thus making it possible to increase the program verification speed.

FIG. 9 is a diagram illustrating a program voltage VWLs applied to the selected word line WLs and bit line voltages VBL1~VBL5 applied to the bit lines BL1~BL5, in the program loop LOOP(n) of FIG. 6. The program voltage Vpgm(n) is applied to the selected word line WLs. According to the program verification results of the previous program loop LOOP(n−1), bit line voltages of different levels may be applied to the bit lines BL1~BL5.

For example, if the previous program verification result is Fail, a bit line program voltage (e.g., 0V) may be applied. If the previous program verification result is Pre-Pass, a bit line forcing voltage (e.g., 1V) may be applied. If the previous program verification result is Final Pass, a program inhibit voltage (e.g., Vcc) may be applied.

Referring to FIG. 9, during application of the program voltage Vpgm(n), a bit line forcing voltage of about 1V is applied to the first bit line BL1. Likewise, a bit line forcing voltage of about 1V is also applied to the second and fifth bit lines BL2 and BL5. The reason for application of the bit line forcing voltage to the bit lines BL1, BL2 and BL5 is that the cells A, B and E are determined as Pre-Pass in the previous program loop LOOP(n−1) (see FIG. 8).

A bit line program voltage of about 0V is applied to the third and fourth bit lines BL3 and BL4. The reason for application of the bit line program voltage to the bit lines BL3 and BL4 is that the cells C and D are determined as Fail in the previous program loop LOOP(n−1) (see FIG. 8).

After application of the program voltage Vpgm(n) and the bit line voltages VBL1~VBL5, the program verify voltage VFY(n) may be applied to the selected word line WLs. The program verify voltage VFY(n) may include TV2 for verification of the state P2 and TV3 for verification of the state P3. Also, a read voltage for program verification may be provided to the bit lines BL1~BL5.

FIG. 10 is a diagram illustrating the threshold voltages of the cells A, B, C, D and E after application of the program voltage Vpgm(n) in LOOP(n). Referring to FIG. 10, the threshold voltages of the cells A and C are between TV1 and TV2. Also, the threshold voltages of the cells B and D are between TV2 and TV3. Also, the threshold voltage of the cell E is higher than TV3.

Referring to FIG. 10, the threshold voltage of the cell A is higher than the pre-verify voltage PV2 (i.e., TV1) and lower than the target verify voltage TV2. Thus, as a result of the program verification, the cell A will be determined as Pre-Pass. The threshold voltage of the cell B is higher than the target verify voltage TV2. Thus, as a result of the program verification, the cell B will be determined as Final Pass.

The threshold voltage of the cell C is lower than the pre-verify voltage PV2. Thus, as a result of the program verification, the cell C will be determined as Fail. The threshold voltage of the cell D is higher than the pre-verify voltage PV3 (i.e., TV2) and lower than the target verify voltage TV3. Thus, as a result of the program verification, the cell D will be determined as Pre-Pass. The threshold voltages of the cell E is higher than the target verify voltage TV3. Thus, as a result of the program verification, the cell E will be determined as Final Pass.

FIG. 11 is a table illustrating the program verification results after application of the program voltage Vpgm(n). Referring to FIG. 11, the cells A and D are determined as Pre-Pass; the cells B and E are determined as Final Pass; and the cell C is determined as Fail.

Because the cells A and D are Pre-Pass, the program voltage Vpgm(n+1) and the bit line forcing voltage (about 1V) will be applied in the next program loop. Because the cells B and E are Final Pass, the program voltage Vpgm(n+1) and the program inhibit voltage (Vcc) will be applied in the next program loop. Because the cell C is Fail, the program voltage Vpgm(n+1) and the bit line program voltage (about 0V) will be applied in the next program loop.

FIG. 12 is a diagram illustrating a voltage VWLs applied to the selected word line WLs and bit line voltages VBL1~VBL5 applied to the bit lines BL1~BL5, in the program loop LOOP(n+1) of FIG. 6. The program voltage Vpgm (n+1) is applied to the selected word line WLs. According to the program verification results of the previous program loop LOOP(n), a bit line forcing voltage, a program inhibit voltage or a bit line program voltage may be applied to the bit lines BL1~BL5.

Referring to FIG. 12, during application of the program voltage Vpgm(n+1), a bit line forcing voltage (about 1V) is applied to the first bit line BL1. A program inhibit voltage (Vcc) is applied to the second bit line BL2. A bit line program voltage (about 0V) is applied to the third bit line BL3. A bit line forcing voltage (about 1V) is applied to the fourth bit line BL4. A program inhibit voltage (Vcc) is applied to the fifth bit line BL5.

After application of the program voltage Vpgm(n+1) and the bit line voltages VBL1~VBL5, the program verify voltage VFY(n+1) may be applied to the selected word line WLs. The program verify voltage VFY(n+1) may include TV2 for verification of the state P2 and TV3 for verification of the state P3. Also, a read voltage for program verification may be provided to the bit lines BL1~BL5.

FIG. 13 is a diagram illustrating the threshold voltages of the cells A, B, C, D and E after application of the program voltage Vpgm(n+1) in LOOP(n+1). Referring to FIG. 13, the threshold voltages of the cells A, B and C are between TV2 and TV3. Also, the threshold voltages of the cells D and E are higher than TV3.

Referring to FIG. 13, the threshold voltage of the cell A is higher than the target verify voltage TV2. Thus, as a result of the program verification, the cell A will be determined as Final Pass. The cell B will maintain the program verification result (i.e., Final Pass) of the previous program loop LOOP (n). The threshold voltage of the cell C is higher than the pre-verify voltage PV3 (i.e., TV2) and lower than the target verify voltage TV3. Thus, as a result of the program verification, the cell C will be determined as Pre-Pass. The threshold voltage of the cell D is higher than the target verify voltage TV3. Thus, as a result of the program verification, the cell D will be determined as Final Pass. The cell E will maintain the program verification result (i.e., Final) of the previous program loop LOOP(n).

FIG. 14 is a table illustrating the program verification results after application of the program voltage Vpgm(n+1). Referring to FIG. 14, the cells A, B, D and E are determined as Final Pass, and the cell C is determined as Pre-Pass. Because the cells A and D are Pre-Pass, the bit line forcing voltage (about 1V) will be applied in the next program loop LOOP(n+2). Because the cells A, B, D and E are Final Pass, the program inhibit voltage (Vcc) will be applied in the next program loop.

Figure 15:
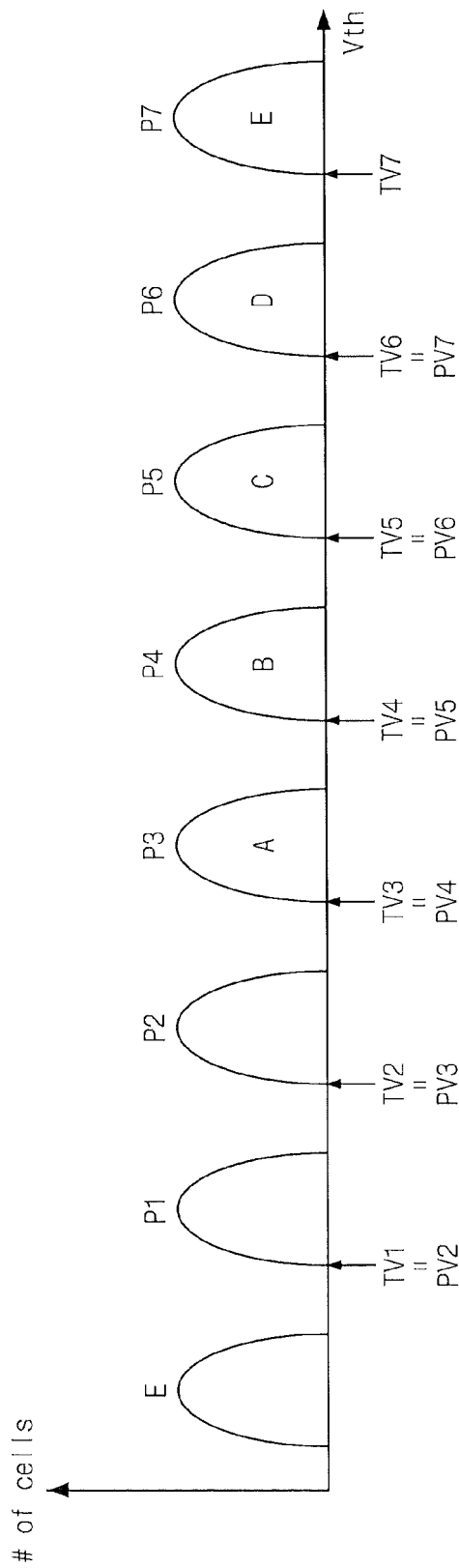
FIG. 15 is a diagram illustrating another example of the target threshold voltages of the memory cells A, B, C, D and E illustrated in FIG. 1.

FIG. 15 illustrates the case where the memory cells A, B, C, D and E of FIG. 1 may have 8 states E, P1, P2, P3, P4, P5, P6 and P7. In this case, 3-bit data may be stored in each memory cell. FIG. 15 is a diagram illustrating another example of the target threshold voltages of the memory cells A, B, C, D and E illustrated in FIG. 1.

If the cell A is programmed from the state E to the state P3, the pre-verify voltage of the cell A is PV3 (i.e., TV2) and the target verify voltage is TV3. If the cell B is programmed from the state E to the state P4, the pre-verify voltage of the cell B is PV4 (i.e., TV3) and the target verify voltage is TV4. If the cell C is programmed from the state E to the state P5, the pre-verify voltage of the cell C is PV5 (i.e., TV4) and the target verify voltage is TV5. If the cell D is programmed from the state E to the state P6, the pre-verify voltage of the cell D is PV6 (i.e., TV5) and the target verify voltage is TV6. If the cell E is programmed from the state E to the state P7, the pre-verify voltage of the cell E is PV7 (i.e., TV6) and the target verify voltage is TV7.

As described above, the pre-target state may have a threshold voltage distribution lower by one or more levels than the target state. FIGS. 5 and 15 are examples where the pre-target state has a threshold voltage distribution lower by one level than the target state. However, the pre-target state may have a threshold voltage distribution lower by two or more levels than the target state. For example, in FIG. 15, the target verify voltage of the cell A may be TV3 and the pre-verify voltage may be TV1 or TV2. The target verify voltage of the cell B may be TV4 and the pre-verify voltage may be one of TV1 to TV3. Likewise, the target verify voltage of the cell E may be TV7 and the pre-verify voltage may be one of TV1 to TV6.

Figure 16:
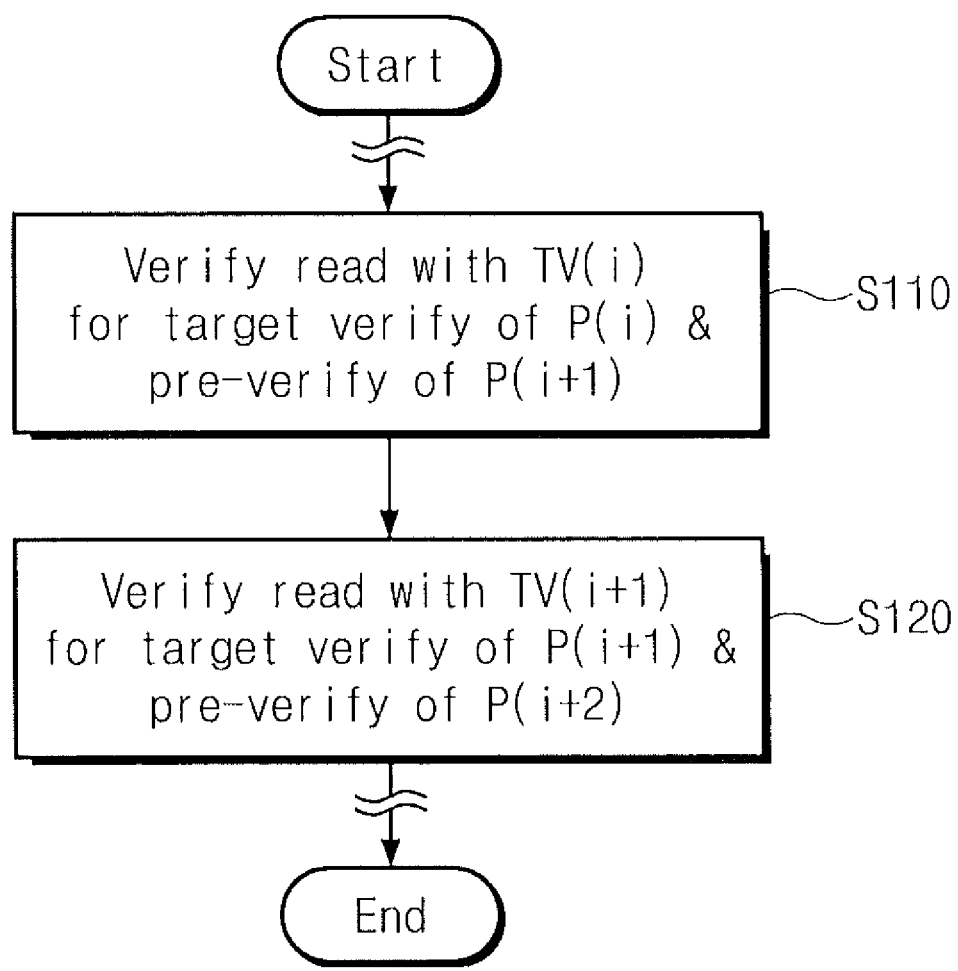
FIG. 16 is a flow chart illustrating a program method of the nonvolatile memory device illustrated in FIG. 1 according to some embodiments of the present invention.

FIG. 16 is a flow chart illustrating a program method of the nonvolatile memory device 100 illustrated in FIG. 1. In operation S110, a target verify operation for a state P(i) and a pre-verify operation for a state P(i+1) are performed simultaneously. For example, assume that the cell A is programmed into the state P(i) and the cell B is programmed into the state P(i+1). Also assume that a target verify voltage for the state P(i) is TVi. By using the target verify voltage TVi, the nonvolatile memory device 100 may simultaneously determine whether the cell A has reached the target state and whether the cell B has reached the pre-target state.

In operation S120, a target verify operation for a state P(i+1) and a pre-verify operation for a state P(i+2) are performed simultaneously. By using the target verify voltage TVi, the nonvolatile memory device 100 may simultaneously determine a memory cell has reached a target state or a pre-target state.

If the program verification result is Pre-Pass, the nonvolatile memory device 100 of FIG. 1 controls the bit line voltage of the next program loop according to the program verification result, thus making it possible to reduce the threshold voltage distribution of the memory cell. Also, the nonvolatile memory device 100 of FIG. 1 uses the target verify voltages as the pre-verify voltages, thus making it possible to increase the program verification speed.

Figure 17:
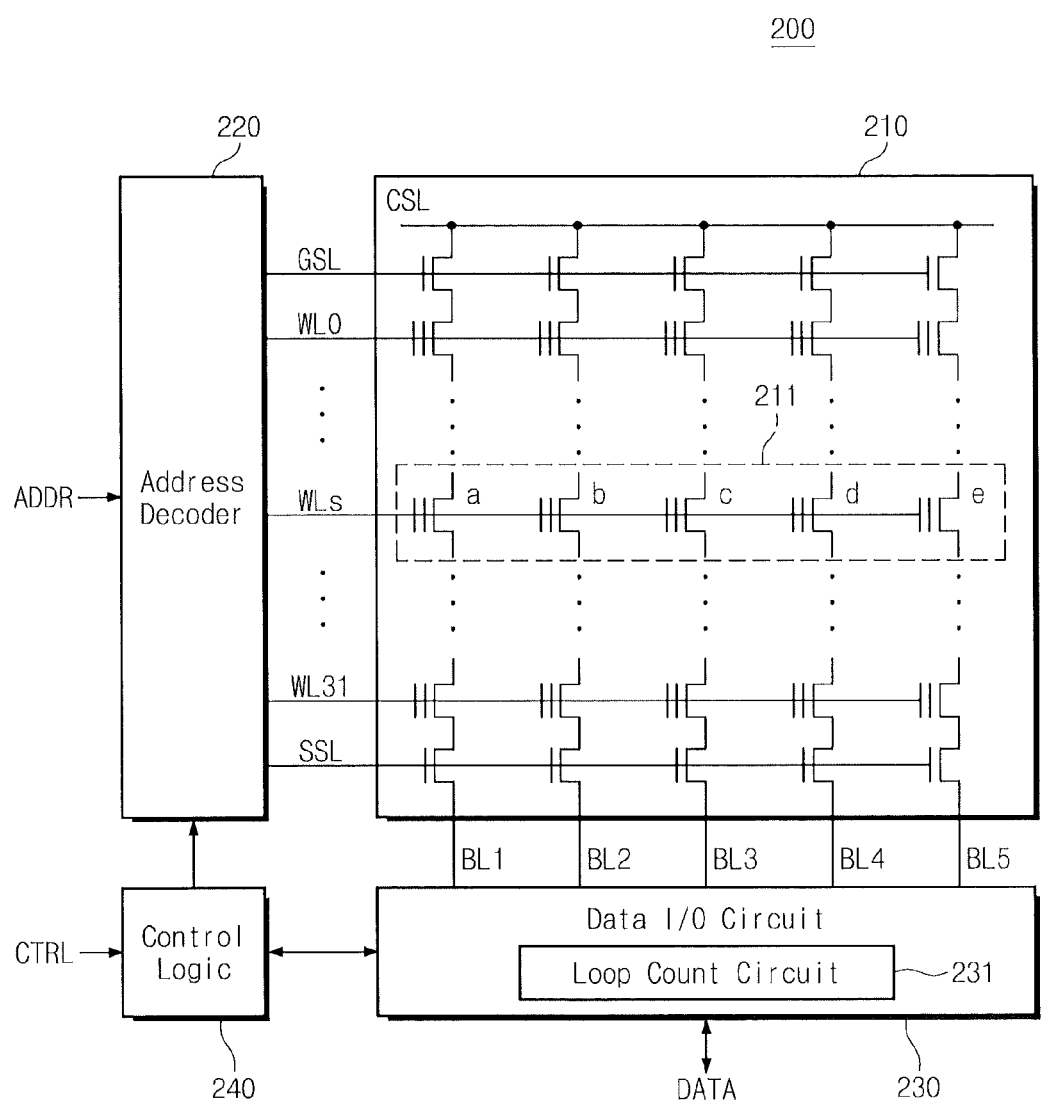
FIG. 17 is a block diagram of a nonvolatile memory device according to further embodiments of the present invention.

FIG. 17 is a block diagram of a nonvolatile memory device according to some embodiments of the present invention.

Referring to FIG. 17, a nonvolatile memory device 200 includes a memory cell array 210, an address decoder 220, a data input/output circuit 230, and a control logic unit 240. In some embodiments, the nonvolatile memory device 200 comprises a flash memory, which may be a NAND, NOR, and/or a One_NAND type flash memory.

The memory cell array 210 includes a selected page 211. The selected page 211 may include a plurality of memory cells a, b, c, d and e. The address decoder 220 may transfer a bias voltage for a program/read operation to a selected word line WLs. The data input/output circuit 230 may transfer program data to the selected page 211 or may read data from the selected page 211. The control logic unit 240 may control the address decoder 220 and the data input/output circuit 230.

Referring to FIG. 17, the data input/output circuit 230 may include a loop count circuit 231. The loop count circuit may have a NOP (no operation) state, a START state, an ADD state, and a STOP state. The ADD state may be omitted, may occur once, or may repeat several times. Also, the STOP state may be omitted, or may repeat several times.

The loop count circuit 231 may include a loop counter (not illustrated) corresponding to each memory cell. If the memory cell changes from a Fail state to a Pre-Pass state, the corresponding loop counter may be set to a START state (e.g., 01 or 001). In the subsequent program loops, the loop counter may be set to an ADD state (e.g., 10 or 010) or a STOP state (e.g., 11 or 011).

Figure 18:
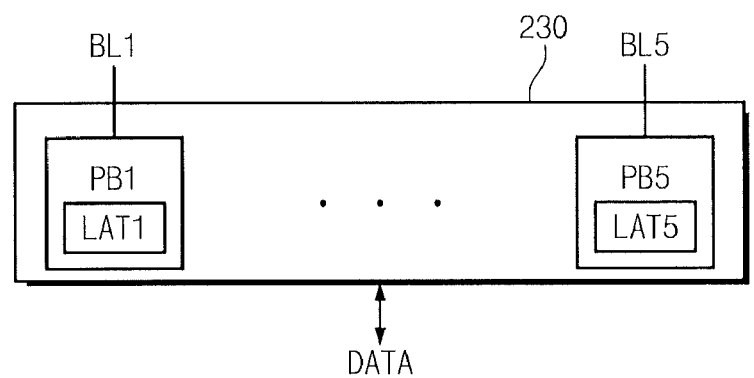
FIG. 18 is a block diagram of a data input/output circuit illustrated in FIG. 17 storing a loop count value in each page buffer.

The loop count circuit 231 may store a loop count value. For example, the loop count circuit 231 may use a register or a latch to store a loop count value. The register and the latch may be included in each page buffer. FIG. 18 is a block diagram of the data input/output circuit 230 storing a loop count value in each page buffer. Referring to FIG. 18, page buffers PB1~PB5 include latches LAT1~LAT5. Each of latches LAT1~LAT5 may store a loop count value.

In the event of a Pre-Pass state, the nonvolatile memory device 100 of FIG. 1 applies a bit line forcing voltage in the next program loop. On the other hand, in the event of a Pre-Pass state, the nonvolatile memory device 200 of FIG. 17 applies a bit line forcing voltage after a predetermined program loop. A bit line program voltage is applied in the predetermined program loop. The nonvolatile memory device 200 of FIG. 17 can perform a program operation more rapidly through a loop counting operation.

Figure 19:
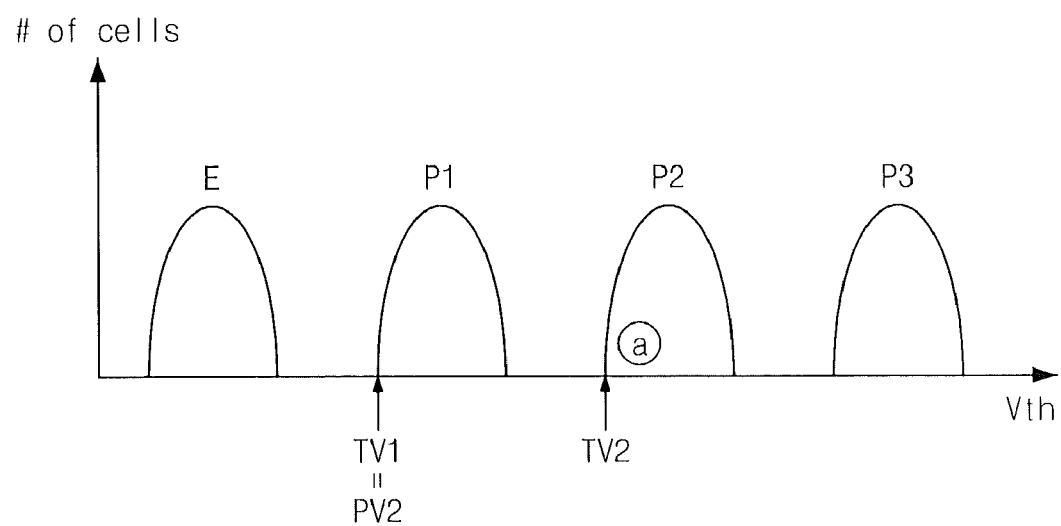
FIG. 19 is a diagram illustrating an example of the target threshold voltage of a memory cell (e.g., a) illustrated in FIG. 17.

FIG. 19 is a diagram illustrating an example of the target threshold voltage of a memory cell (e.g., a) illustrated in FIG. 17. As illustrated in FIG. 19, it is assumed that the cell a (denoted by a circle) is programmed from the state E to the state P2. Also, it is assumed that the cells c to e (denoted by triangles) are programmed from the state E to the state P3. The target verify voltage of the cell a is TV2, and the pre-verify voltage is PV2 (i.e., TV1).

Figure 20:
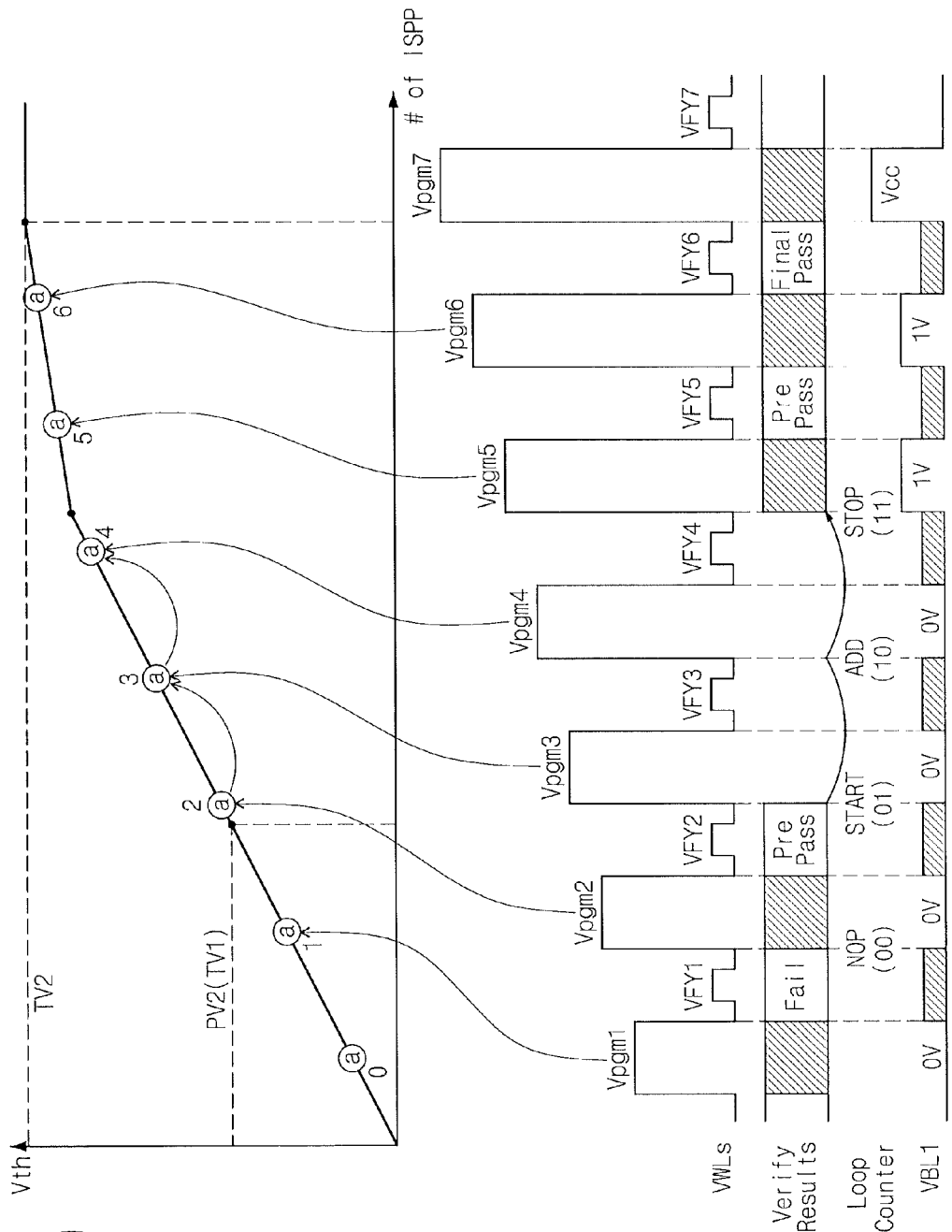
FIGS. 20 and 21 are diagrams illustrating a program process of a memory cell illustrated in FIG. 17.

FIG. 20 is a diagram illustrating a program process of the cell a illustrated in FIG. 19. FIG. 20 illustrates a threshold voltage change of the cell a, the selected word line voltage VWLs, the program verification result, the loop counter, and the bit line voltage VBL1. It is assumed that the cell a moves from a point 0 to a point 6 according to a program voltage Vpgm. Also, it is assumed that the point 0 is an erase state.

When a first program voltage Vpgm1 is applied to the cell a, the cell a moves to the point 1. The cell a will be determined to be in a Fail state because it failed to reach the pre-verify voltage PV2 (i.e., TV1). At this point, the loop count circuit is in an NOP state. Because the cell a is in a Fail state, a bit line program voltage (e.g., 0V) will be applied to the bit line BL1 in the next program loop.

When a second program voltage Vpgm2 and a bit line program voltage (0V) are applied to the cell a, the cell a moves to the point 2. The cell a will be determined to be in a Pre-Pass state because it has reached the pre-verify voltage PV2 (i.e., TV1). At this point, the loop count circuit is in a START state. Because the cell a is in a Pre-Pass state and the loop count circuit is in a START state, a bit line program voltage (0V) will be applied to the bit line BL1 in the next program loop.

If the memory cell is in a Pre-pass state, the nonvolatile memory device 100 of FIG. 1 applies a bit line forcing voltage (1V) in the next program loop. On the other hand, the nonvolatile memory device 200 of FIG. 17 may apply a bit line program voltage (0V) or a bit line forcing voltage (1V) according to the state of the loop count circuit 231. A bit line program voltage (0V) is applied in the case of a START state or an ADD state, and a bit line forcing voltage (1V) is applied in the case of a STOP state.

When a third program voltage Vpgm3 and a bit line program voltage (0V) are applied to the cell a, the cell a moves to the point 3. The cell a will maintain a Pre-Pass state because it failed to reach the target verify voltage TV2. At this point, the loop count circuit becomes an ADD state. Because the cell a is in a Pre-Pass state and the loop count circuit is in an ADD state, a bit line program voltage (0V) will be applied in the next program loop.

When a fourth program voltage Vpgm4 and a bit line program voltage (0V) are applied to the cell a, the cell a moves to the point 4. The cell a will maintain a Pre-Pass state because it failed to reach the target verify voltage TV2. At this point, the loop count circuit becomes a STOP state. Because the cell a is in a Pre-Pass state and the loop count circuit is in a STOP state, a bit line forcing voltage (1V) will be applied in the next program loop.

When a fifth program voltage Vpgm5 and a bit line forcing voltage (1V) are applied to the cell a, the cell a moves to the point 5. The cell a will maintain a Pre-Pass state because it failed to reach the target verify voltage TV2. Because the cell a is in a Pre-Pass state and the loop count circuit is in a STOP state, a bit line forcing voltage (1V) will be applied in the next program loop.

When a sixth program voltage Vpgm6 and a bit line forcing voltage (1V) are applied to the cell a, the cell a moves to the point 6. The cell a will become a Final Pass state because it reached the target verify voltage TV2. Because the cell a is in a Final Pass state, a bit line inhibit voltage (Vcc) will be applied in the next program loop.

The nonvolatile memory device of FIG. 17 may apply a bit line forcing voltage after a predetermined program loop after the memory cell becomes a Pre-Pass state. Although FIG. 20 illustrates that a bit line forcing voltage (1V) is applied after two program loops, the bit line forcing voltage may be applied after two or more program loops.

When the loop count value is set to 1, the loop count circuit 231 changes from a START state to a STOP state. In this case, the nonvolatile memory device 200 becomes a Pre-Pass state, and applies a bit line forcing voltage (1V) after one program loop. When the loop count value is set to 2, the loop count circuit 231 becomes a START state, an ADD state and a STOP state as illustrated in FIG. 20. In this case, the nonvolatile memory device 200 becomes a Pre-Pass state, and applies a bit line forcing voltage (1V) after two program loops.

The nonvolatile memory device 200 may set a loop count value to 3 or more. When the loop count value is set to 3, the loop count circuit 231 becomes a START state, an ADD state, an ADD state and a STOP state. In this case, the nonvolatile memory device 200 becomes a Pre-Pass state, and applies a bit line forcing voltage (1V) after three program loops.

Figure 21:
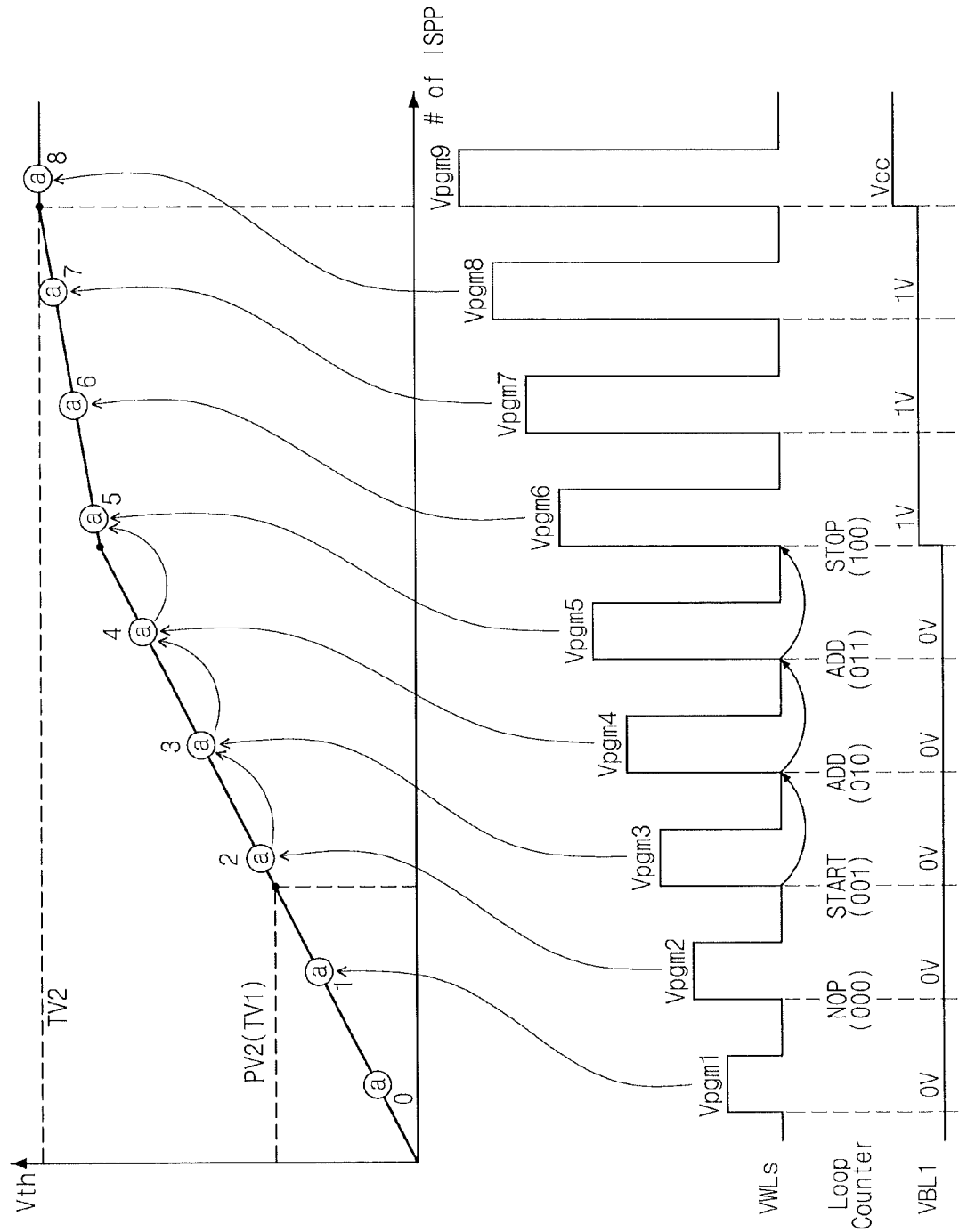

FIG. 21 is a diagram illustrating an exemplary case where a loop count value is set to 3. In FIG. 21, illustration of the program verify process is omitted. It is assumed that the cell a moves from a point 0 to a point 8 according to a program voltage Vpgm. Also, it is assumed that the point 0 is an erase state.

When a first program voltage Vpgm1 is applied to the cell a, the cell a moves to the point 1. The cell a will be determined to be in a Fail state because it failed to reach the pre-verify voltage PV2 (i.e., TV1). At this point, the loop count circuit is in an NOP state (000). A second program voltage Vpgm2 and a bit line program voltage (0V) will be applied in the next program loop.

If the cell a moves to the point 2, the cell a will be determined to be in a Pre-Pass state because it has reached the pre-verify voltage PV2 (i.e., TV1). In this case, the loop count circuit becomes a START state (001). Because the cell a is in a Pre-Pass state and the loop count circuit is in a START state (001), a third program voltage Vpgm3 and a bit line program voltage (0V) will be applied in the next program loop.

If the cell a moves to the point 3, the cell a will maintain a Pre-Pass state because it failed to reach the target verify voltage TV2. In this case, the loop count circuit becomes an ADD state (010). Because the cell a is in a Pre-Pass state and the loop count circuit is in an ADD state (010), a fourth program voltage Vpgm4 and a bit line program voltage (0V) will be applied in the next program loop.

If the cell a moves to the point 4, the cell a will maintain a Pre-Pass state because it failed to reach the target verify voltage TV2. In this case, the loop count circuit becomes an ADD state (011). Because the cell a is in a Pre-Pass state and the loop count circuit is in an ADD state (011), a fifth program voltage Vpgm5 and a bit line program voltage (0V) will be applied in the next program loop.

If the cell a moves to the point 5, the cell a will maintain a Pre-Pass state because it failed to reach the target verify voltage TV2. In this case, the loop count circuit becomes a STOP state (100). Because the cell a is in a Pre-Pass state and the loop count circuit is in a STOP state (100), a sixth program voltage Vpgm6 and a bit line forcing voltage (1V) will be applied in the next program loop.

If the cell a moves to the point 6 and the point 7, the cell a will maintain a Pre-Pass state because it failed to reach the target verify voltage TV2. Thus, a bit line forcing voltage (1V) will be applied in the next program loop. If the cell a moves to the point 8, the cell a will become a Final Pass state because it has reached the target verify voltage TV2. Thus, a program inhibit voltage (Vcc) will be applied in the next program loop.

The nonvolatile memory device 200 of FIG. 17 may control a loop count value. The loop count value may be set in a chip fabrication stage in some embodiments of the present invention. That is, a chip manufacturer may calculate a loop count value on the basis of the result obtained through a program test and may set the loop count value in a chip fabrication stage in a hardware-based manner.

The loop count value may be set after a chip fabrication stage in other embodiments of the present invention. That is, a chip manufacturer or a user may input or change the loop count value while using the nonvolatile memory device 200. FIG. 20 corresponds to the case of setting the loop count value to 2, and FIG. 21 corresponds to the case of setting the loop count value to 3. The nonvolatile memory device 200 controls the loop count value, thus making it possible to reduce the threshold voltage distribution or increase the program speed. Hereinafter, an operation of the nonvolatile memory device 200 according to an embodiment of the present invention will be described in detail on the basis of an exemplary case where the loop count value is set to 2.

Figure 22:
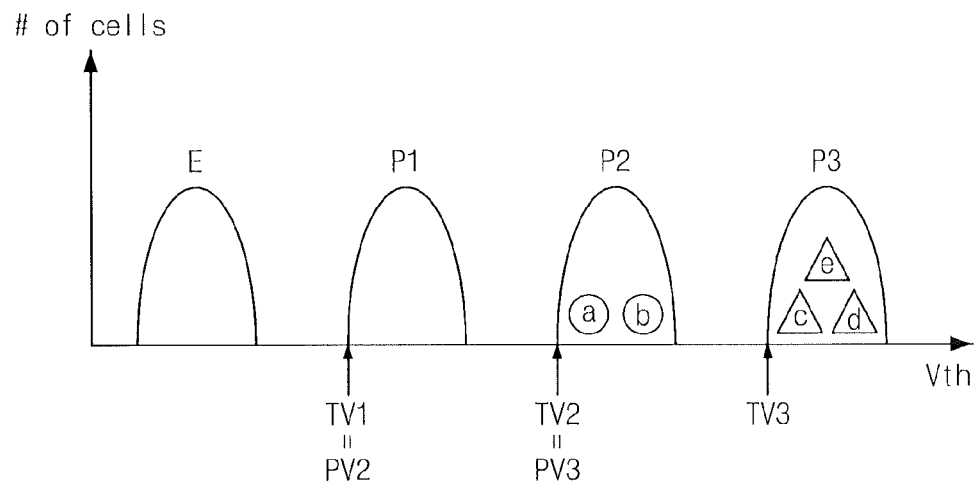
FIG. 22 is a diagram illustrating an example of the target threshold voltages of memory cells a, b, c, d and e illustrated in FIG. 17.

FIG. 22 is a diagram illustrating an example of the target threshold voltages of the memory cells a, b, c, d and e illustrated in FIG. 17. As illustrated in FIG. 22, it is assumed that the cells a and b (denoted by circles) are programmed from the state E to the state P2. Also, it is assumed that the cells c to e (denoted by triangles) are programmed from the state E to the state P3.

Figure 23:
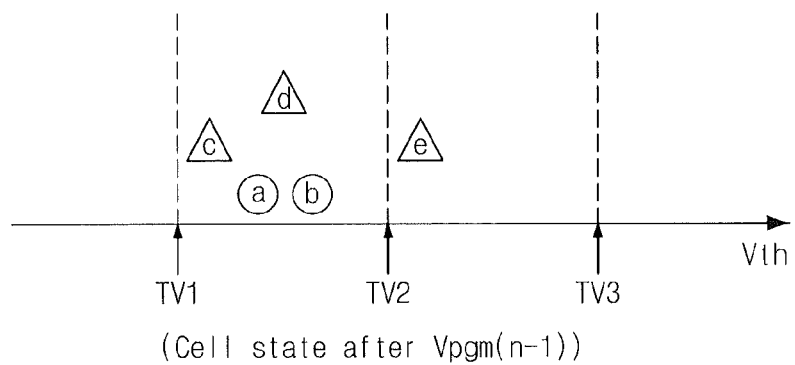
FIGS. 23 and 24 illustrate the program verification results and the threshold voltages of memory cells after application of Vpgm(n−1)
Figures 24, 25:
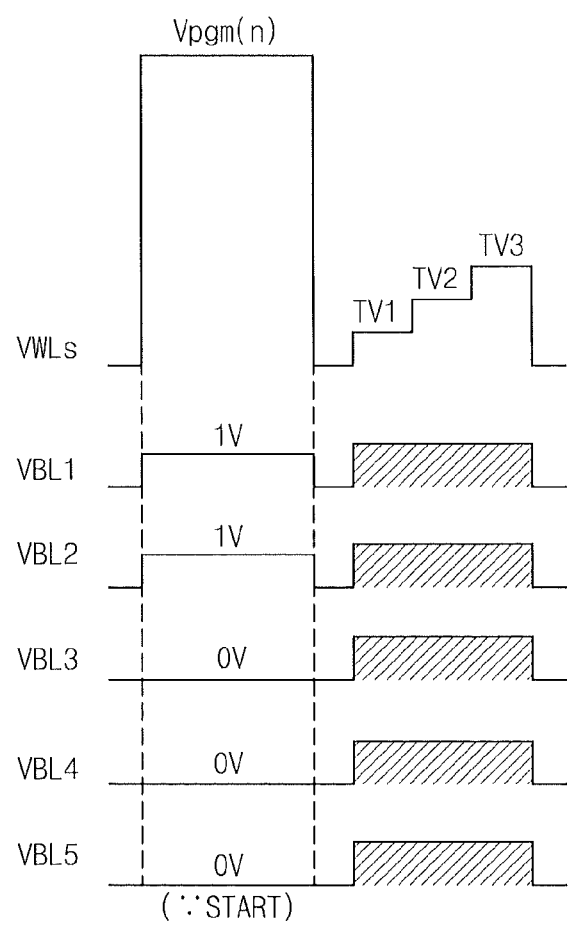
FIGS. 25 to 27 illustrate the program verification results and the threshold voltages of memory cells after application of Vpgm(n)
Figures 26, 27:
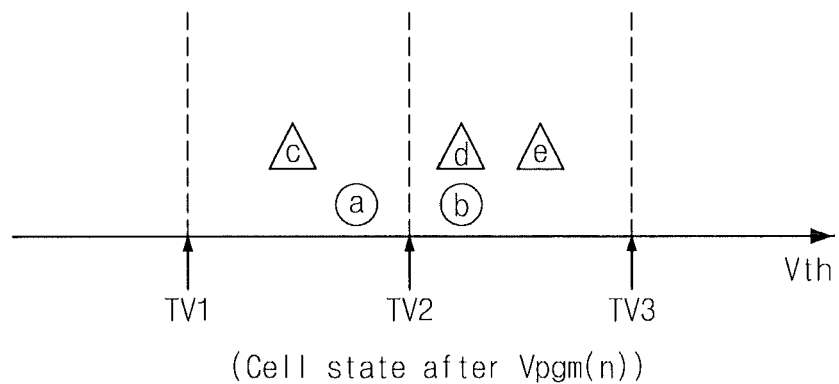
Figure 28:
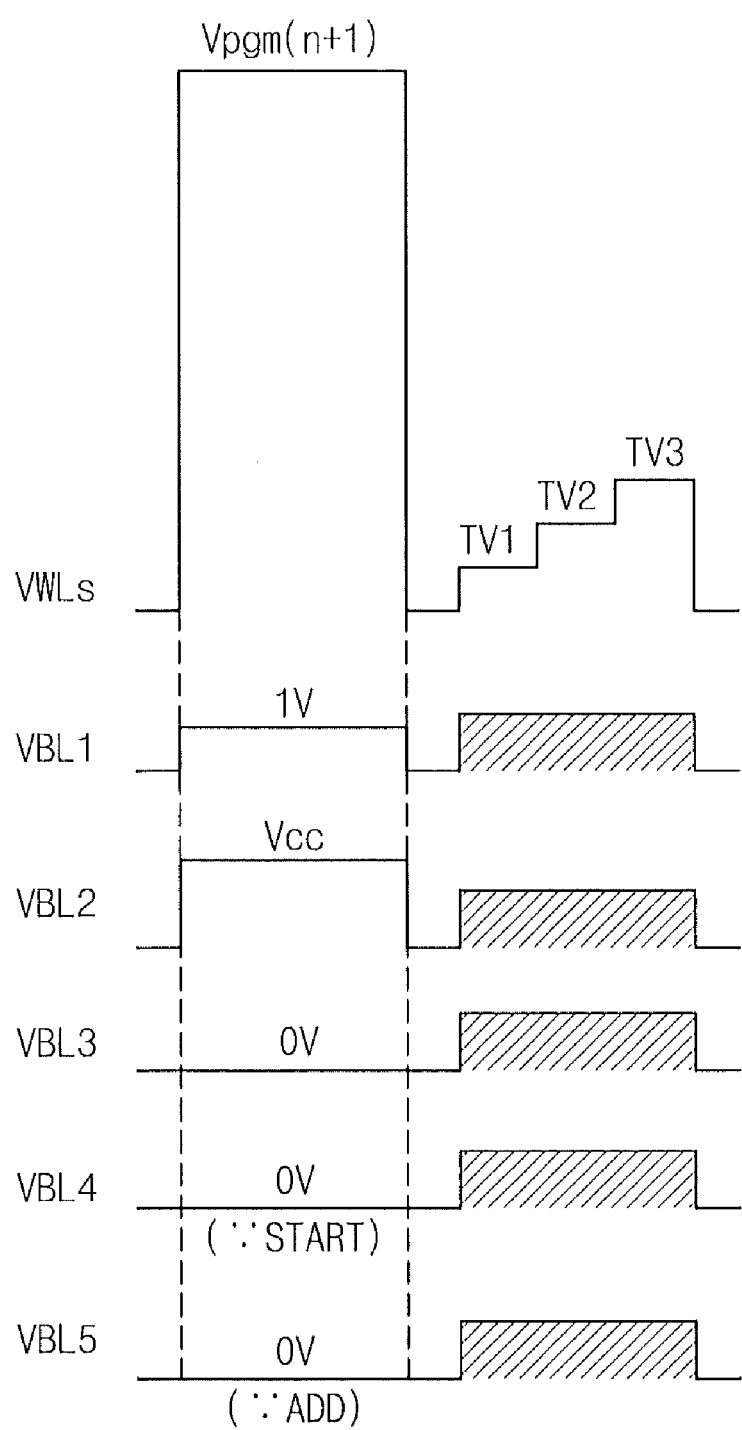
FIGS. 28 to 30 illustrate the program verification results and the threshold voltages of memory cells after application of Vpgm(n+1)
Figures 29, 30:
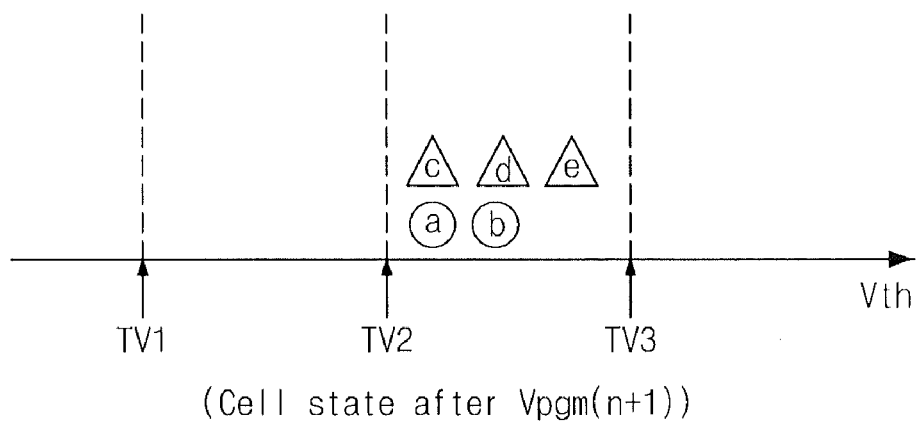
Figure 31:
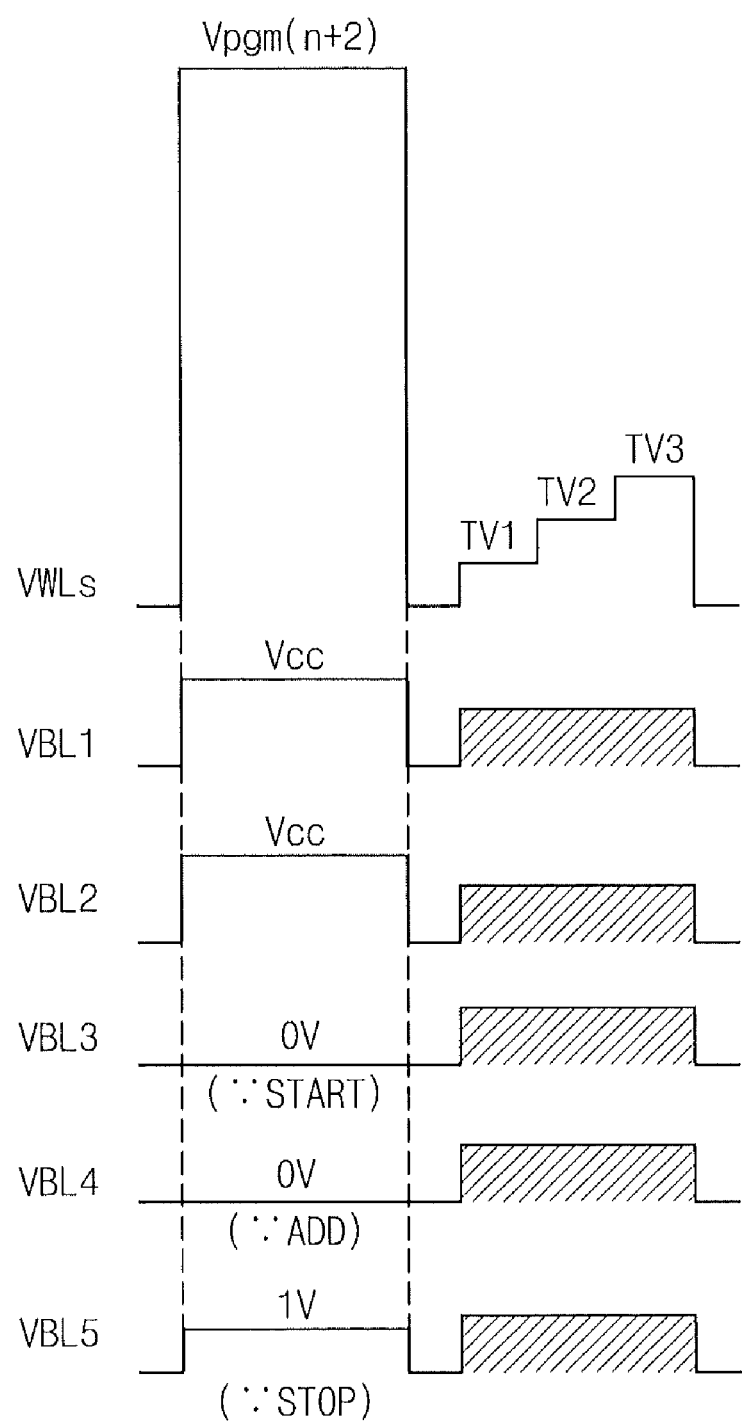
FIGS. 31 to 33 illustrate the program verification results and the threshold voltages of memory cells after application of Vpgm(n+2)
Figures 32, 33:
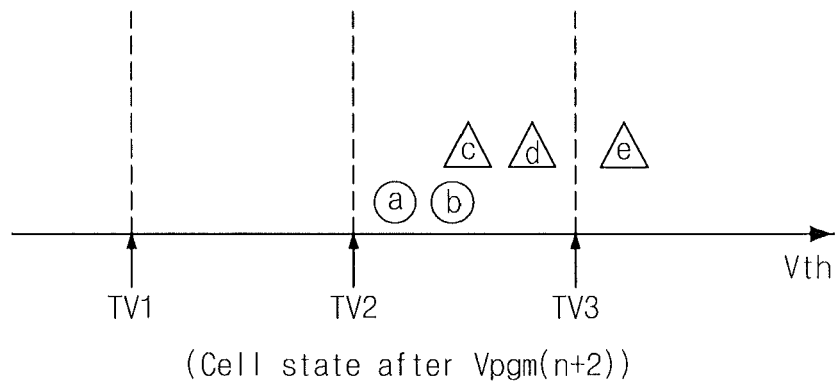

FIGS. 23 and 24 illustrate the program verification results and the threshold voltages of memory cells after application of Vpgm(n−1). FIGS. 25 to 27 illustrate the program verification results and the threshold voltages of memory cells after application of Vpgm(n). FIGS. 28 to 30 illustrate the program verification results and the threshold voltages of memory cells after application of Vpgm(n+1). FIGS. 31 to 33 illustrate the program verification results and the threshold voltages of memory cells after application of Vpgm(n+2).

FIG. 23 is a diagram illustrating the threshold voltages of the memory cells a, b, c, d and e after application of the program voltage Vpgm(n−1). Referring to FIG. 23, the threshold voltages of the cells a to d are between TV1 and TV2. Also, the threshold voltage of the cell e is between TV2 and TV3.

FIG. 24 is a table illustrating the program verification results after application of the program voltage Vpgm(n−1). Referring to FIGS. 23 and 24, the cells a, b and e are determined as Pre-Pass because they are in a pre-target state. Also, the cells c and d are determined as Fail because they failed to reach a pre-target state.

The cells a and b are in a Pre-Pass state, and the loop counters corresponding to the cells a and b are in a STOP state (11). Thus, a bit line forcing voltage (1V) will be applied in the next program loop. The cells c and d are in a Fail state, and the corresponding loop counters are in an NOP state (00). Thus, a bit line program voltage (0V) will be applied in the next program loop. The cell e has reached the pre-target state. Thus, the cell e is in a Pre-Pass state, and the corresponding loop counter is in a START state (01). Thus, a bit line program voltage (0V) will be applied in the next program loop.

FIG. 25 is a diagram illustrating the program voltage Vpgm (n) and the bit line voltages VBL1~VBL5 in the program loop LOOP(n). According to the program verification results of the previous program loop and the state of the loop count circuit, a bit line forcing voltage (1V) or a bit line program voltage (0V) may be applied to the bit lines BL1~BL5.

Referring to FIG. 25, during application of the program voltage Vpgm(n), a bit line forcing voltage (1V) is applied to the first and second bit lines BL1 and BL2. The reason for application of the bit line forcing voltage to the bit lines BL1 and BL2 is that the cells a and b were determined as Pre-Pass in the previous program loop and the corresponding loop counters are in a STOP state (11).

A bit line program voltage (0V) is applied to the third to fifth bit lines BL3 to BL5. The reason for application of the bit line program voltage (0V) to the bit lines BL3 and BL4 is that the cells c and d were determined as Fail in the previous program loop. The reason for application of the bit line program voltage (0V) to the fifth bit line BL5 is that the cell e was determined as Pre-Pass in the previous program loop and the corresponding loop counter is in a START state (01).

FIG. 26 is a diagram illustrating the threshold voltages of the memory cells a, b, c, d and e after application of the program voltage Vpgm(n). Referring to FIG. 26, the threshold voltages of the cells a and c are between TV1 and TV2. Also, the threshold voltage of the cell b, d and e are between TV2 and TV3.

FIG. 27 is a table illustrating the program verification results after application of the program voltage Vpgm(n). Referring to FIGS. 26 and 27, the cells a, d and e are determined as Pre-Pass because they are in the pre-target state. The cell c is determined as Fail because it failed to reach the pre-target state. The cell b is determined as Final Pass because it has reached the target state.

The cell a is in a Pre-Pass state, and the corresponding loop counter is in a STOP state (11). Thus, a bit line forcing voltage (1V) will be applied in the next program loop. Because the cell b is in a Final Pass state, a program inhibit voltage (Vcc) will be applied in the next program loop. Because the cell c is in a Fail state, a bit line program voltage (0V) will be applied in the next program loop. The cells d and e are in a Pre-Pass state, and the corresponding loop counters are in a START state (01) and an ADD state (10), respectively. Thus, a bit line program voltage (0V) will be applied in the next program loop.

FIG. 28 is a diagram illustrating the program voltage Vpgm (n+1) and the bit line voltages VBL1~VBL5 in the program loop LOOP(n+1). According to the program verification results of the previous program loop and the state of the loop count circuit, a program inhibit voltage (Vcc), a bit line forcing voltage (1V) or a bit line program voltage (0V) may be applied to the bit lines BL1~BL5.

Referring to FIG. 28, during application of the program voltage Vpgm(n+1), a bit line forcing voltage (1V) is applied to the first bit line BL1. The reason for this is that the cell a was determined as Pre-Pass in the previous program loop and the corresponding loop counter is in a STOP state (11). A program inhibit voltage (Vcc) is applied to the second bit line BL2. The reason for this is that the cell b was determined as Final Pass in the previous program loop.

A bit line program voltage (0V) is applied to the third to fifth bit lines BL3 to BL5. The reason for application of the bit line program voltage (0V) to the bit line BL3 is that the cell c was determined as Fail in the previous program loop. The reason for application of the bit line program voltage (0V) to the fourth bit line BL4 is that the cell d was determined as Pre-Pass in the previous program loop and the corresponding loop counter is in a START state (01). The reason for application of the bit line program voltage (0V) to the fifth bit line BL5 is that the cell e was determined as Pre-Pass in the previous program loop and the corresponding loop counter is in an ADD state (10).

FIG. 29 is a diagram illustrating the threshold voltages of the memory cells a, b, c, d and e after application of the program voltage Vpgm(n+1). Referring to FIG. 29, the threshold voltages of the cells a to e are between TV2 and TV3.

FIG. 30 is a table illustrating the program verification results after application of the program voltage Vpgm(n+1). Referring to FIGS. 29 and 30, the cells a and b are determined as Final Pass. The cells c to e are determined as Pre-Pass.

Because the cells a and b are in a Final Pass state, a program inhibit voltage (Vcc) will be applied in the next program loop. The cells c and d are in a Pre-Pass state, and the corresponding loop counters are in a START state (01) and an ADD state (10), respectively. Thus, a bit line program voltage (0V) will be applied in the next program loop. The cell e is in a Pre-Pass state, and the corresponding loop counter is in a STOP state (11). Thus, a bit line forcing voltage (1V) will be applied in the next program loop.

FIG. 31 is a diagram illustrating the program voltage Vpgm(n+2) and the bit line voltages VBL1~VBL5 in the program loop LOOP(n+2). According to the program verification results of the previous program loop and the state of the loop count circuit, a program inhibit voltage (Vcc), a bit line forcing voltage (1V) or a bit line program voltage (0V) may be applied to the bit lines BL1~BL5.

Referring to FIG. 31, during application of the program voltage Vpgm(n+2), a program inhibit voltage (Vcc) is applied to the first and second bit lines BL1 and BL2. The reason for this is that the cells a and b were determined as Final Pass in the previous program loop.

A bit line program voltage (0V) is applied to the third and fourth bit lines BL3 and BL4. The reason for application of the bit line program voltage (0V) to the bit line BL3 is that the cell c was determined as Pre-Pass in the previous program loop and the corresponding loop counter is in a START state (01). The reason for application of the bit line program voltage (0V) to the fourth bit line BL4 is that the cell d was determined as Pre-Pass in the previous program loop and the corresponding loop counter is in an ADD state (10).

A bit line forcing voltage (1V) is applied to the fifth bit line BL5. The reason for application of the bit line forcing voltage (1V) to the fifth bit line BL5 is that the cell e was determined as Pre-Pass in the previous program loop and the corresponding loop counter is in a STOP state (11).

FIG. 32 is a diagram illustrating the threshold voltages of the memory cells a, b, c, d and e after application of the program voltage Vpgm(n+2). Referring to FIG. 29, the threshold voltages of the cells a to d are between TV2 and TV3. Also, the threshold voltage of the cell e is higher than TV3.

FIG. 33 is a table illustrating the program verification results after application of the program voltage Vpgm(n+2). Referring to FIGS. 32 and 33, the cells a, b and e are determined as Final Pass, and the cells c and d are determined as Pre-Pass.

Because the cells a, b and e are in a Final Pass state, a program inhibit voltage (Vcc) will be applied in the next program loop. The cell c is in a Pre-Pass state, and the corresponding loop counter is in an ADD state (10). Thus, a bit line program voltage (0V) will be applied in the next program loop. The cell d is in a Pre-Pass state, and the corresponding loop counter is in a STOP state (11). Thus, a bit line forcing voltage (1V) will be applied in the next program loop.

Figure 34:
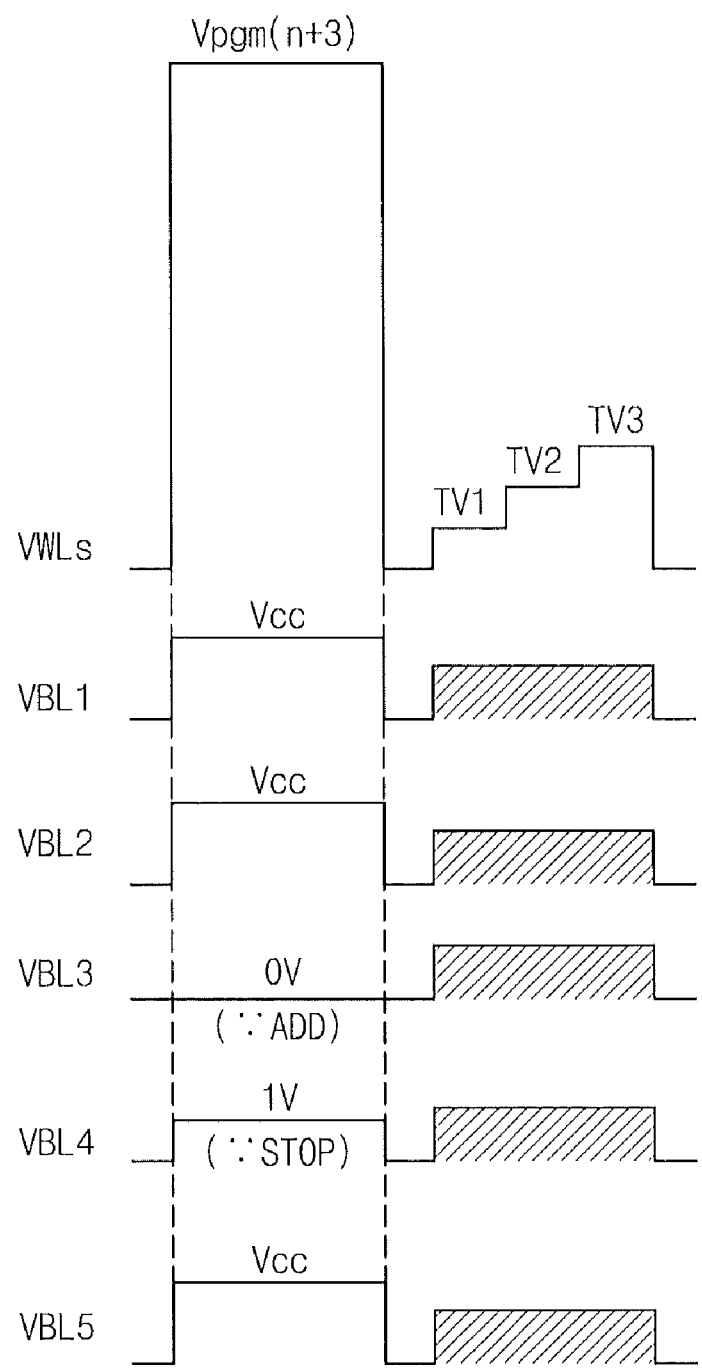
FIG. 34 is a diagram illustrating a program voltage Vpgm(n+3) and bit line voltages VBL1~VBL5 during LOOP(n+3)

FIG. 34 is a diagram illustrating the program voltage Vpgm(n+3) and the bit line voltages VBL1~VBL5 in the program loop LOOP(n+3). According to the program verification results of the previous program loop and the state of the loop count circuit 231, a program inhibit voltage (Vcc), a bit line forcing voltage (1V) or a bit line program voltage (0V) may be applied to the bit lines BL1~BL5.

Referring to FIG. 34, during application of the program voltage Vpgm(n+3), a program inhibit voltage (Vcc) is applied to the bit lines BL1, BL2 and BL5. The reason for this is that the cells a, b and e were determined as Final Pass in the previous program loop.

A bit line program voltage (0V) is applied to the third bit line BL3. The reason for application of the bit line program voltage (0V) to the bit line BL3 is that the cell c was determined as Pre-Pass in the previous program loop and the corresponding loop counter is in an ADD state (01).

A bit line forcing voltage (1V) is applied to the fourth bit line BL4. The reason for application of the bit line forcing voltage (1V) to the fourth bit line BL4 is that the cell d was determined as Pre-Pass in the previous program loop and the corresponding loop counter is in a STOP state (11).

The nonvolatile memory device 200 of FIG. 17 controls the bit line voltage of the next program loop according to the program verification result, thus making it possible to reduce the threshold voltage distribution of the memory cell. Also, the nonvolatile memory device 200 of FIG. 17 uses the loop count circuit 231 and uses the target verify voltage as the pre-verify voltage, thus making it possible to increase the program speed.

Embodiments of the present invention have been described above in which one pre-pass state is used between a fail state and a final pass state for programming a non-volatile memory cells. In other embodiments of the present invention, multiple levels of pre-pass states may be used, which have multiple levels of forcing voltages associated therewith. In such embodiments, the closer the pre-pass state is to the final pass state, the closer the associated forcing voltage is to the program-inhibit voltage level and vice versa.

The nonvolatile memory devices according to the embodiments of the present invention can be used or applied in various products. The nonvolatile memory devices according to some embodiments of the present invention can be implemented not only in electronic devices such as, but not limited to, personal computers, digital cameras, camcorders, game consoles, televisions, routers, GPS systems, portable phones, MP3, PMP, PSP, and Personal Digital Assistants (PDAs), but also in storage devices such as memory cards, USB memories, and solid state drives (SSDs).

Figure 35:
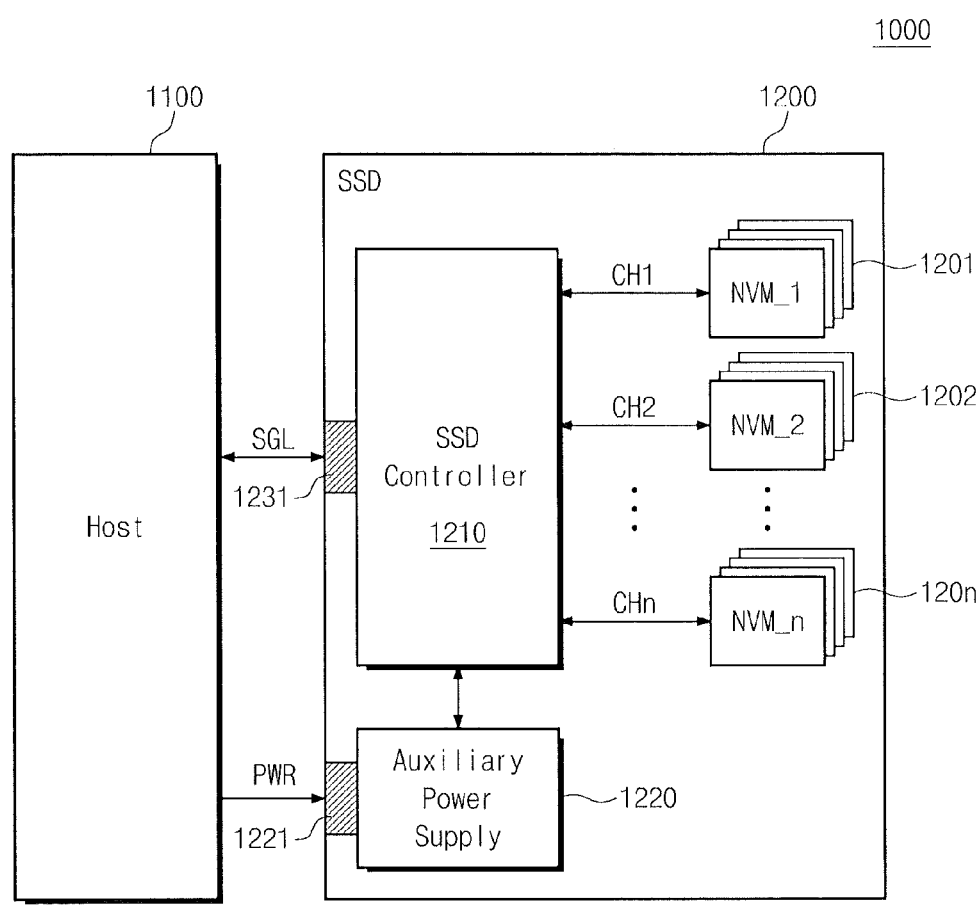
FIG. 35 is a block diagram of a solid state drive (SSD) system including a nonvolatile memory device according to some embodiments of the present invention.

FIG. 35 is a block diagram of a solid state drive (SSD) system including a nonvolatile memory device according to some embodiments of the present invention.

Referring to FIG. 35, an SSD system 1000 includes a host 1100 and an SSD 1200. The SSD 1200 communicates signals with the host 1100 through a signal connector 1231, and receives power through a power connector 1221. The SSD 1200 includes a plurality of nonvolatile memory (NVM) devices 1201~120n, an SSD controller 1210, and an auxiliary power supply 1220.

The nonvolatile memory devices 1201~120n are used as a storage medium of the SSD 1200. The nonvolatile memory devices 1201~120n may be implemented using a flash memory device with a large storage capacity. The SSD 1200 generally uses flash memories, and may also use other nonvolatile memory devices such as PRAMs, MRAMs, ReRAMs, and FRAMs.

In FIG. 35, at least one nonvolatile memory device may include the nonvolatile memory device 100 or 200 illustrated in FIG. 1 or FIG. 17. That is, the nonvolatile memory device controls the bit line voltage of the next program loop according to the program verification result, thus making it possible to reduce the threshold voltage distribution of a memory cell. Also, the nonvolatile memory device uses the target verify voltage as the pre-verify voltage, thus making it possible to increase the program verification speed.

The nonvolatile memory devices 1201~120n may be connected through a plurality of channel CH1~CHn to the SSD controller 1210. One or more memory devices may be connected to each channel. The memory devices connected to one channel may be connected to the same data bus.

The SSD controller 1210 communicates signals SGL with the host 1100 through the signal connector 1231. Herein, the signals SGL may include commands, addresses, and data. According to the commands of the host 1100, the SSD controller 1210 writes/reads data in/from the corresponding memory devices. The internal structure of the SSD controller 1210 will be described later in detail with reference to FIG. 36.

The auxiliary power supply 1220 is connected through the power connector 121 to the host 1100. The auxiliary power supply 1220 may be charged by receiving power PWR from the host 1100. The auxiliary power supply 1220 may be located in or outside the SSD 1200. For example, the auxiliary power supply 1220 may be located in the main board to supply auxiliary power to the SSD 1220.

Figure 36:
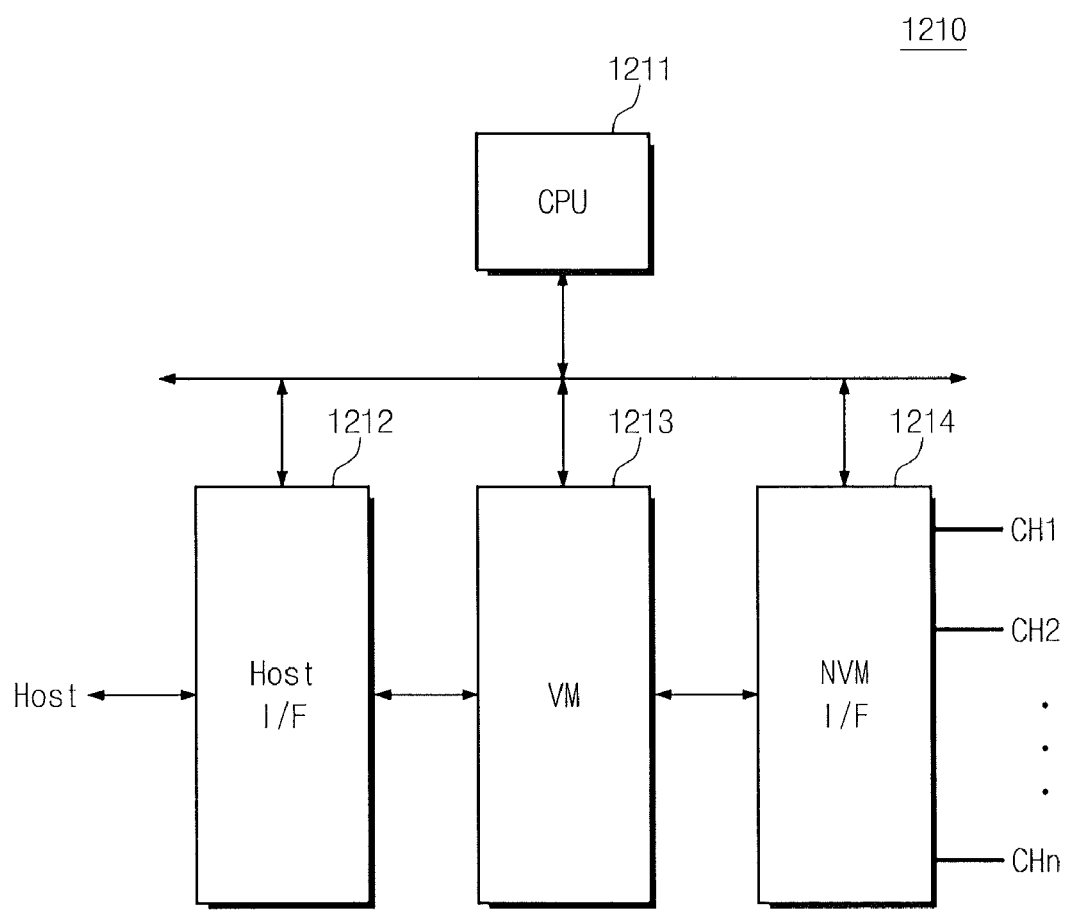
FIG. 36 is a block diagram of an SSD controller illustrated in FIG. 35.

FIG. 36 is a block diagram of the SSD controller 1210 illustrated in FIG. 35.

Referring to FIG. 36, the SSD controller 1210 includes a central processing unit (CPU) 1211, a host interface 1212, a volatile memory (VM) 1213, and an NVM interface 1214.

The CPU 1211 analyzes and processes signals SGL received from the host 1100. The CPU 1211 controls the host 1100 or the nonvolatile memory devices 1201~120n through the host interface 1212 or the NVM interface 1214. The CPU 1211 controls the operations of the nonvolatile memory devices 1201~120n according to the firmware for driving the SSD 1200.

The host interface 1212 provides an interface with the SSD 1200 in accordance with the protocol of the host 1100. The host interface 1212 may communicate with the host 1100 by means of Universal Serial Bus (USB), Small Computer System Interface (SCSI), PCI Express, ATA, Parallel ATA (PATA), Serial ATA (SATA), Serial Attached SCSI (SAS), etc. Also, the host interface 1212 may perform a disk emulation function that assists the host 1100 to recognize the SSD 1200 as a hard disk drive (HDD).

The VM 1213 temporarily stores the write data received from the host 1100 or the data read from the NVM devices. The VM 1213 may store cache data or metadata to be stored in the NVM devices 1201~120n. In a sudden power-off operation, cache data or metadata stored in the VM 1213 are stored in the NVM devices 1201~120n. Examples of the VM 1213 include DRAMs and SRAMs.

The NVM interface 1214 scatters data, which are received from the VM 1213, over the respective channels CH1~CHn. The NVM interface 1214 transfers data, which are read from the NVM devices 1201~120n, to the VM 1213. Herein, the NVM interface 1214 may use the interface protocol of a NAND flash memory. That is, the SSD controller 1210 may perform a program/read/erase operation according to the interface protocol of an NAND flash memory.

Figure 37:
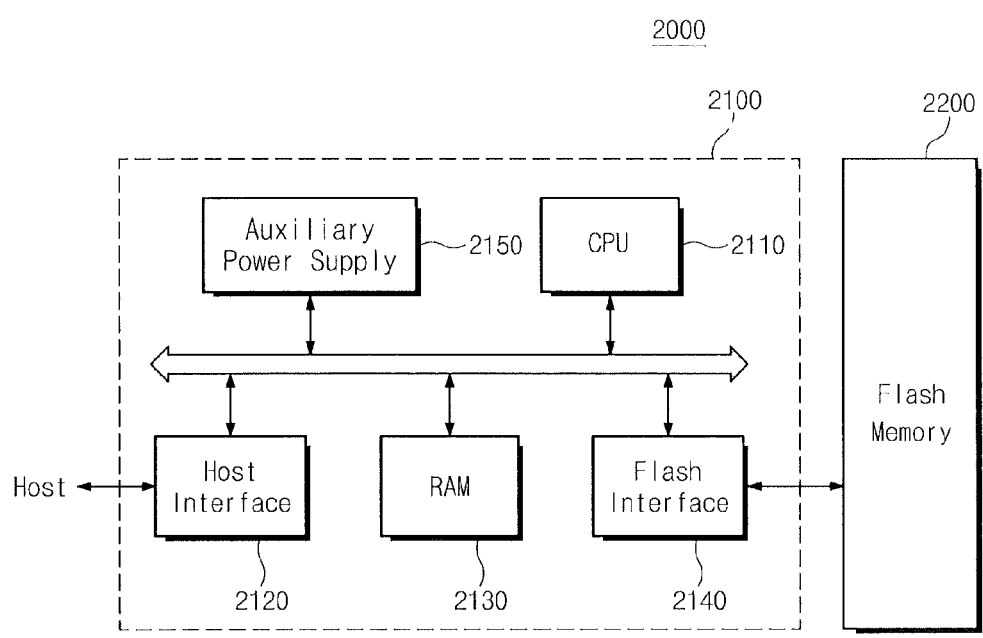
FIG. 37 is a block diagram of a data storage system including a nonvolatile memory device according to some embodiments of the present invention.

FIG. 37 is a block diagram of a data storage including a nonvolatile memory device according to some embodiments of the present invention.

Referring to FIG. 37, a data storage 2000 includes a memory controller 2100 and a flash memory 2200. Examples of the data storage 2000 include storage media such as portable mobile storages (e.g., USB memories) and memory cards (e.g., SDs and MMCs).

The memory controller 2100 includes a CPU 2110, a host interface 2120, a random access memory (RAM) 2130, a flash interface 2140, and an auxiliary power supply 2150. The auxiliary power supply 2150 may be located in or outside the memory controller 2100.

The data storage 2000 is connected to a host for use. The data storage 2000 communicates data with the host through the host interface 2120, and communicates data with the flash memory 2200 through the flash interface 2140. The data storage 2000 receives power from the host to perform an internal operation.

The flash memory 2200 of FIG. 37 controls a bit line voltage of the next program loop according to the program verification result, thus making it possible to reduce the threshold voltage distribution of a memory cell. Also, the flash memory 2200 of FIG. 37 uses a target verify voltage as a pre-verify voltage, thus making it possible to increase the program verification speed.

Figure 38:
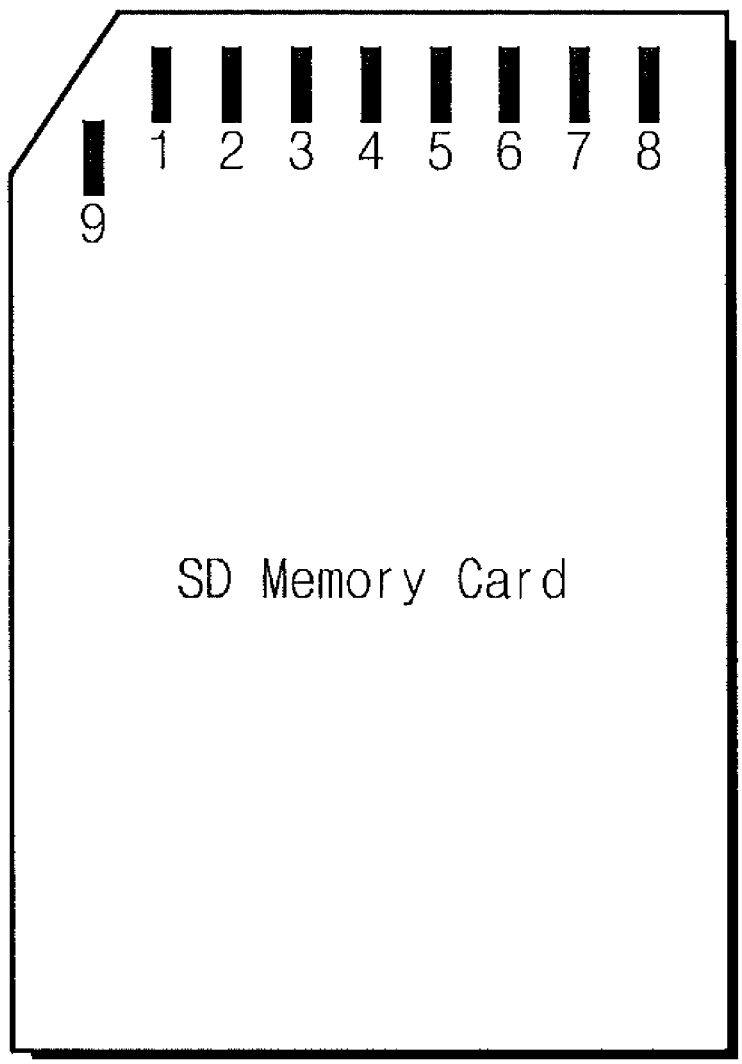
FIG. 38 is a diagram illustrating the external shape of a memory card including a nonvolatile memory device according to some embodiments of the present invention.

FIG. 38 is a diagram illustrating the external shape of a memory card including a nonvolatile memory device according to some embodiments of the present invention. FIG. 38 illustrates the external shape of an SD card among memory cards.

Referring to FIG. 38, the SD card includes 9 pins. The SD card has 4 data pins (e.g., 1, 7, 8 and 9), one command pin (e.g., 2), one clock pin (e.g., 5), and 3 power pins (e.g., 3, 4 and 6).

Herein, command signals or response signals are transferred through the command pin 2. In general, command signals are transmitted from a host to the memory card, and response signals are transmitted from the memory card to the host.

Figure 39:
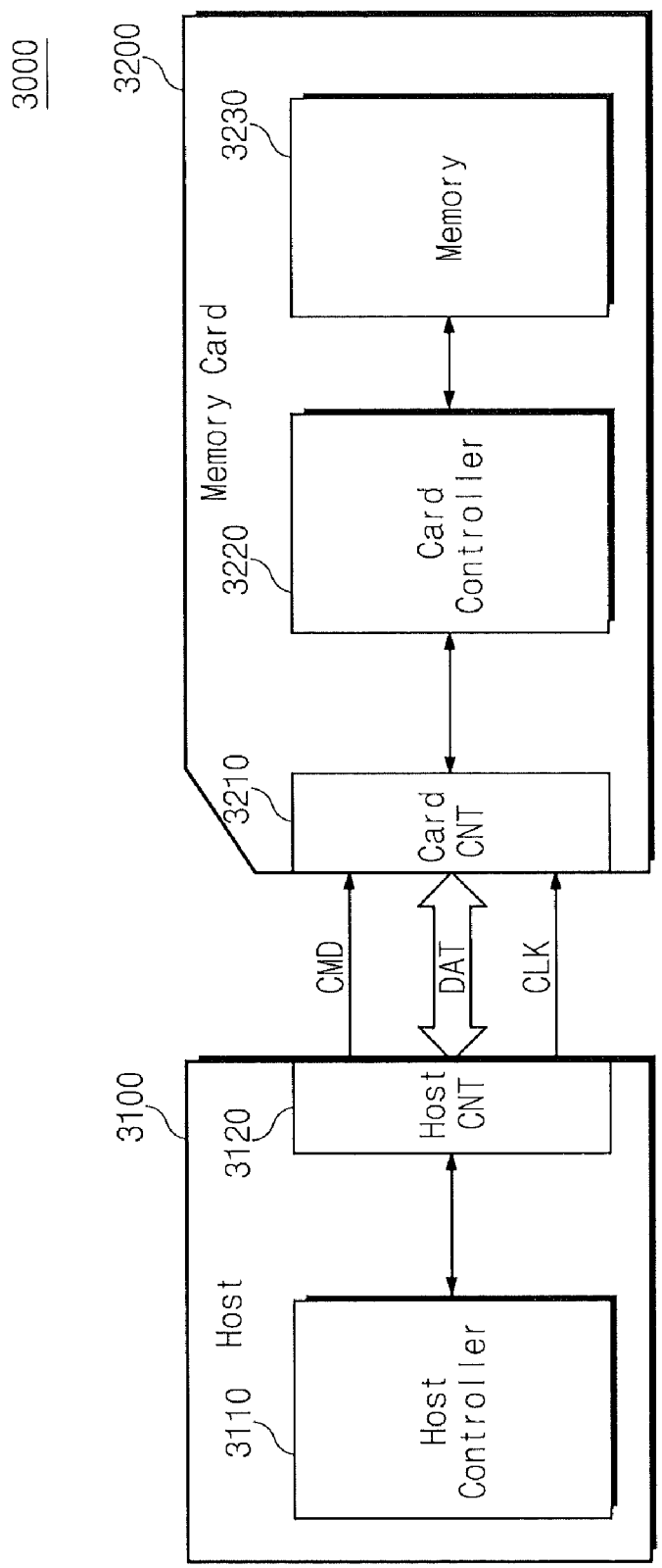
FIG. 39 is a block diagram illustrating the host-related connection and the configuration of the memory card illustrated in FIG. 38.

FIG. 39 is a block diagram illustrating the host-related connection and the configuration of the memory card illustrated in FIG. 38.

Referring to FIG. 39, a memory card system 3000 includes a host 3100 and a memory card 3200. The host 3100 includes a host controller 3110 and a host connection unit 3120. The memory card 3200 includes a card connection unit 3210, a card controller 3220, and a memory 3230.

The host connection unit 3120 and the card connection unit 3210 include a plurality of pins, examples of which include command pins, data pins, clock pins, and power pins. The number of pins depends on the type of the memory card 3200. For example, an SD card has 9 pins.

The host 3100 writes/reads data in/from the memory card 3200. The host controller 3110 transmits a command (e.g., a write command), a clock signal CLK generated by a clock generator (not illustrated) in the host 3100, and data DAT through the host connection unit 3120 to the memory card 3200.

The card controller 3220 stores data in the memory 3230, in response to a write command received through the card connection unit 3210, in synchronization with a clock signal generated by a clock generator (not illustrated) in the card controller 3220. For example, if the host 3100 is a digital camera, image data are stored in the memory 3230.

Herein, the memory 3230 includes the nonvolatile memory device illustrated in FIG. 1 or FIG. 7. The memory 3230 controls a bit line voltage of the next program loop according to the program verification result, thus making it possible to reduce the threshold voltage distribution of a memory cell. Also, the memory 3230 uses a target verify voltage as a pre-verify voltage, thus making it possible to increase the program verification speed.

Figure 40:
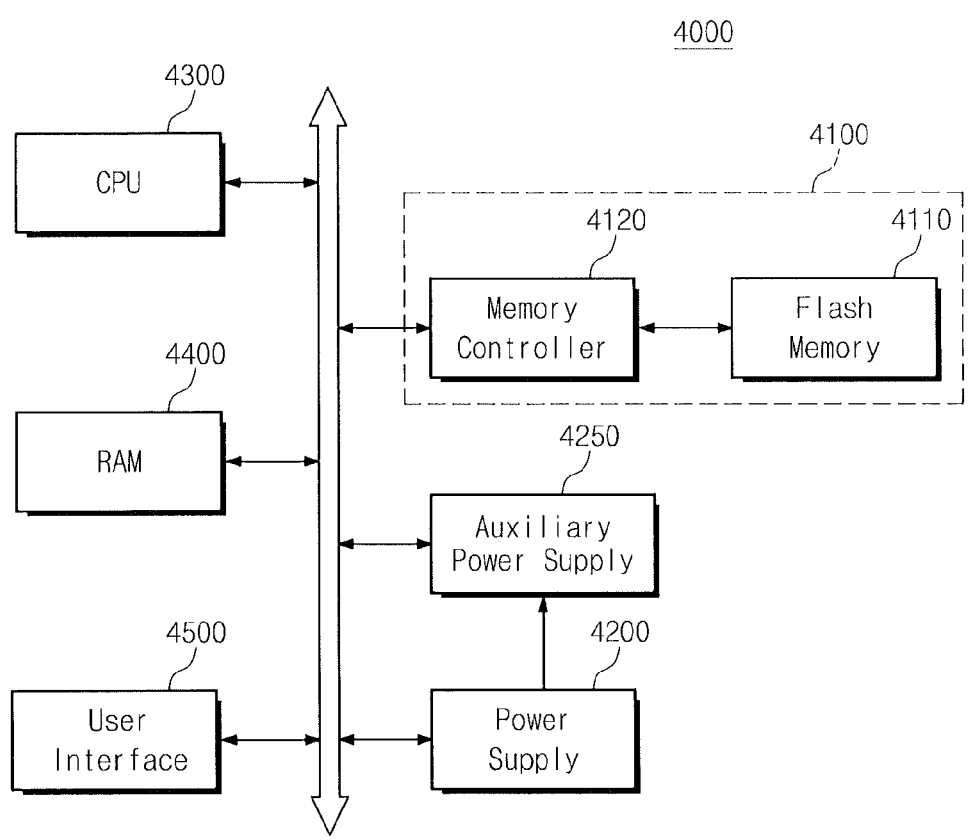
FIG. 40 is a block diagram of an electronic apparatus including a nonvolatile memory device according to some embodiments of the present invention.

FIG. 40 is a block diagram of an electronic apparatus 4000 including a nonvolatile memory device according to some embodiments of the present invention. The electronic apparatus 4000 may include a personal computer (PC) or portable electronic devices such as notebook computers, portable phones, PDAs, and cameras.

Referring to FIG. 40, the electronic apparatus 4000 includes a semiconductor memory device 4100, a power supply 4200, an auxiliary power supply 4250, a CPU 4300, a RAM 4400, and a user interface 4500. The semiconductor memory device 4100 includes a flash memory 4110 and a memory controller 4120.

The flash memory 4110 of FIG. 40 controls a bit line voltage of the next program loop according to the program verification result, thus making it possible to reduce the threshold voltage distribution of a memory cell. Also, the flash memory 4110 of FIG. 40 uses a target verify voltage as a pre-verify voltage, thus making it possible to increase the program verification speed.

As described above, the nonvolatile memory devices according to some embodiments of the present invention can reduce the threshold voltage distribution and can increase the program speed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A method of programming a non-volatile memory device, comprising:
performing a first program-verify loop on a memory cell of the non-volatile memory device having a plurality of programmable states associated therewith, the first program-verify loop comprising a first program operation and a first at least one verify operation; and
determining that the memory cell is in a pass state when a result of the at least one verify operation indicates the memory cell is in a targeted programmed state, is in a pre-pass state when the result of the at least one verify operation indicates that the memory cell is in within a defined state difference of the targeted programmed state, and is in a fail state when the result of the at least one verify operation indicates that the memory cell is not within the defined state difference of the targeted programmed state;
wherein performing the first at least one verify operation comprises:
using a target verify voltage for one of the programmable states as a pre-pass verify voltage for another one of the programmable states to determine that the memory cell is in the pre-pass state.

2. The method of claim 1, further comprising:
performing a second program-verify loop on the memory cell of the non-volatile memory device, the second program-verify loop comprising a second program operation and a second at least one verify operation;
wherein performing the second program operation comprises applying a program-inhibit voltage to a bit-line associated with the memory cell when the memory cell is in the targeted programmed state, applying a forcing voltage to the bit-line associated with the memory cell when the memory cell is in the pre-pass state, and applying a programming voltage to the bit-line associated with the memory cell when the memory cell is in the fail state.

3. The method of claim 2, wherein the forcing voltage is between the program-inhibit voltage and the programming voltage.

4. The method of claim 1, wherein the target verify voltage for the one of the programmable states is less than a target verify voltage for the another one of the programmable states.

5. The method of claim 1, wherein the defined state difference comprises at least one of the plurality of programmable states between a current programmed state of the memory cell and the targeted programmed state of the memory cell.

6. The method of claim 1, wherein the defined state difference is that there are none of the plurality of programmable states between a current programmed state of the memory cell and the targeted programmed state of the memory cell.

7. A method of programming a non-volatile memory device, comprising:
performing a program-verify loop on a memory cell of the non-volatile memory device having a plurality of programmable states associated therewith, the program-verify loop comprising a program operation and at least one verify operation such that a pre-pass verify operation and a target verify operation are performed simultaneously using a common verify voltage for a first one of the programmable states and a second one of the plurality of programmable states, respectively.

8. The method of claim 7, wherein the memory device comprises a flash memory device.

9. A method of programming a non-volatile memory device, comprising:
performing a first program-verify loop on a memory cell of the non-volatile memory device having a plurality of programmable states associated therewith, the first program-verify loop comprising a first program operation and a first at least one verify operation;
determining that the memory cell is in a pass state when a result of the at least one verify operation indicates the memory cell is in a targeted programmed state, is in a pre-pass state when the result of the at least one verify operation indicates that the memory cell is in within a defined state difference of the targeted programmed state, and is in a fail state when the result of the at least one verify operation indicates that the memory cell is not within the defined state difference of the targeted programmed state; and performing at least one subsequent program-verify loop on the memory cell, each of the at least one subsequent program-verify loop comprising a program operation and at least one verify operation, such that a programming voltage is applied to a bit-line associated with the memory cell when the memory cell is in the pre-pass state until a program-verify loop count is reached or a determination is made that the memory cell is in the targeted programming state;

wherein performing the first at least one verify operation comprises:

using a target verify voltage for one of the programmable states as a pre-pass verify voltage for another one of the programmable states to determine that the memory cell is in the pre-pass state.

10. The method of claim 9, wherein performing the at least one subsequent program-verify loop on the memory cell comprises:

performing the at least one subsequent program-verify loop on the memory cell such that a forcing voltage is applied to the bit-line associated with the memory cell when the program-verify loop count is reached and the memory cell is in the pre-pass state.

11. The method of claim 10, wherein performing the at least one subsequent program-verify loop on the memory cell comprises applying a program-inhibit voltage to the bit-line associated with the memory cell when the memory cell is in the targeted programmed state.

12. The method of claim 11, wherein the forcing voltage is between the program-inhibit voltage and the programming voltage.

13. The method of claim 9, wherein the target verify voltage for the one of the programmable states is less than a target verify voltage for the another one of the programmable states.

14. The method of claim 9, wherein the defined state difference comprises at least one of the plurality of programmable states between a current programmed state of the memory cell and the targeted programmed state of the memory cell.

15. The method of claim 9, wherein the defined state difference is that there are none of the plurality of programmable states between a current programmed state of the memory cell and the targeted programmed state of the memory cell.

16. The method of claim 9, wherein the program-verify loop count is based on a difference between target verify voltages associated with the plurality of programmable states, respectively.

17. The method of claim 9, wherein the program-verify loop count is stored in a page buffer of the non-volatile memory device.

18. The method of claim 17, wherein the page buffer comprises a register and/or a latch for storing the program-verify loop count.

19. A method for programming a nonvolatile memory device including a first memory cell to be programmed into a first program state and a second memory cell to be programmed into a second program state, the method comprising:

providing a program voltage to a word line connected to the first and second memory cells;

providing a first pre-verify voltage for the first program state; and performing a program verification operation for the first and second program states, wherein a target verify voltage for the first program state is used as a second pre-verify voltage for the second program state in the program verification operation;

wherein the first and second memory cells are pre-charged and sensed simultaneously during the program verification operation on the first and second memory cells.

20. A method for programming a nonvolatile memory device including a first memory cell to be programmed into a first program state, a second memory cell to be programmed into a second program state, and a word line connected to the first and second memory cells, the method comprising:

performing a first program loop by providing a program voltage to the word line;

performing a program verification operation on the first and second memory cells; and performing a second program loop according to a result of the program verification operation, wherein a target verify voltage for the first program state is used as a pre-verify voltage for the second program state in the program verification operation;

wherein the first and second memory cells are pre-charged and sensed simultaneously during the program verification operation on the first and second memory cells.

21. The method of claim 20, wherein the nonvolatile memory device further includes a first page buffer connected to the first memory cell through a first bit line and a second page buffer connected to the second memory cell through a second bit line; and wherein a voltage applied to the second bit line in the second program loop is controlled according to the program verification results for the second program state.

22. The method of claim 21, wherein if the threshold voltage of the second memory cell is higher than the pre-verify voltage for the second program state and lower than a target verify voltage for the second program state, the second page buffer is controlled to apply a bit line forcing voltage to the second bit line in the second program loop.

23. The method of claim 22, wherein if the threshold voltage of the second memory cell is lower than the pre-verify voltage for the second program state, the second page buffer is controlled to apply a bit line program voltage to the second bit line in the second program loop.

24. The method of claim 23, wherein if the threshold voltage of the second memory cell is higher than a target verify voltage for the second program state, the second page buffer is controlled to apply a program inhibit voltage to the second bit line in the second program loop.

* * * * *